US012619280B2

(12) United States Patent
Kim et al.

(10) Patent No.: US 12,619,280 B2
(45) Date of Patent: May 5, 2026

(54) WEARABLE ELECTRONIC DEVICE COMPRISING RIGID FLEXIBLE PRINTED CIRCUIT BOARD

(71) Applicant: Samsung Electronics Co., Ltd., Suwon-si (KR)

(72) Inventors: Hansol Kim, Suwon-si (KR); Heeyoung Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 18/598,429

(22) Filed: Mar. 7, 2024

(65) Prior Publication Data

US 2024/0427376 A1 Dec. 26, 2024

Related U.S. Application Data

(63) Continuation of application No. PCT/KR2024/002548, filed on Feb. 28, 2024.

(30) Foreign Application Priority Data

Jun. 23, 2023 (KR) ........................ 10-2023-0081511
Jul. 18, 2023 (KR) ........................ 10-2023-0093452

(51) Int. Cl.
*H05K 1/18* (2006.01)
*G06F 1/16* (2006.01)
(Continued)

(52) U.S. Cl.
CPC ............. *G06F 1/163* (2013.01); *H01Q 1/273* (2013.01); *H05K 1/0278* (2013.01); *H05K 1/189* (2013.01);
(Continued)

(58) Field of Classification Search
CPC ...... G06F 1/163; H01Q 1/273; H05K 1/0278; H05K 1/189
(Continued)

(56) References Cited

U.S. PATENT DOCUMENTS 8,270,914 B2 9/2012 Pascolini et al.
9,692,118 B2 6/2017 Seo et al.
(Continued)

FOREIGN PATENT DOCUMENTS

JP 2006-207042 A 8/2006
JP 2008-032566 A 2/2008
(Continued)

OTHER PUBLICATIONS

International Search Report dated Jun. 14, 2024, issued in International Application No. PCT/KR2024/002548.

*Primary Examiner* — Binh B Tran
(74) *Attorney, Agent, or Firm* — Jefferson IP Law, LLP

(57) ABSTRACT

A wearable electronic device is provided. The wearable electronic device includes a housing including a metal frame, a display within the housing, a bracket within the housing, including a side surface facing an inner surface of the metal frame, a rigid flexible printed circuit board including a rigid portion located between the inner surface of the metal frame and the side surface of the bracket, and an electronic circuitry on the rigid portion, wherein the rigid portion includes a first portion under the electronic circuitry, and a second portion extending from a portion of the first portion toward the display and disposed on the side surface of the bracket so that the rigid portion is supported by the bracket, and wherein the second portion includes a non-conductive portion arranged with respect to a slot between the metal frame and a portion of the display, the slot used to radiate a signal to an external electronic device.

20 Claims, 20 Drawing Sheets

(51) Int. Cl.

| | | |
|---|---|---|
| *H01Q 1/27* | (2006.01) | |
| *H05K 1/02* | (2006.01) | |
| *H05K 1/189* | (2026.01) | |
| *H01Q 13/10* | (2006.01) | |

(52) U.S. Cl.
CPC ... *H01Q 13/10* (2013.01); *H05K 2201/09227* (2013.01); *H05K 2201/10053* (2013.01); *H05K 2201/10151* (2013.01); *H05K 2201/2018* (2013.01)

(58) Field of Classification Search
USPC ........................................................ 361/749
See application file for complete search history.

(56) References Cited

U.S. PATENT DOCUMENTS

| | | | | |
|---|---|---|---|---|
| 10,020,572 | B2 * | 7/2018 | Kim ........................ | G04G 17/04 |
| 10,299,373 | B2 | 5/2019 | Lee et al. | |
| 11,233,312 | B2 | 1/2022 | Kim et al. | |
| 11,552,403 | B2 | 1/2023 | Goh et al. | |
| 2021/0168230 | A1 * | 6/2021 | Baker .................. | G06F 1/1635 |
| 2021/0267043 | A1 | 8/2021 | Yoo et al. | |
| 2022/0151070 | A1 | 5/2022 | Lee et al. | |
| 2023/0176530 | A1 | 6/2023 | Cho et al. | |
| 2024/0103573 | A1 | 3/2024 | Yun et al. | |

FOREIGN PATENT DOCUMENTS

| | | | |
|---|---|---|---|
| KR | 10-2013-0097473 | A | 9/2013 |
| KR | 10-2016-0080855 | A | 7/2016 |
| KR | 10-2003710 | B1 | 7/2019 |
| KR | 10-2021-0014606 | A | 2/2021 |
| KR | 10-2332463 | B1 | 11/2021 |
| KR | 10-2022-0016718 | A | 2/2022 |
| KR | 10-2022-0085593 | A | 6/2022 |
| KR | 10-2023-0001451 | A | 1/2023 |
| KR | 10-2023-0001477 | A | 1/2023 |
| WO | 2019/240538 | A1 | 12/2019 |

* cited by examiner

WEARABLE ELECTRONIC DEVICE COMPRISING RIGID FLEXIBLE PRINTED CIRCUIT BOARD

CROSS-REFERENCE TO RELATED APPLICATION(S)

This application is a continuation application, claiming priority under § 365(c), of an International application No. PCT/KR2024/002548, filed on Feb. 28, 2024, which is based on and claims the benefit of a Korean patent application number 10-2023-0081511, filed on Jun. 23, 2023, in the Korean Intellectual Property Office, and of a Korean patent application number 10-2023-0093452, filed on Jul. 18, 2023, in the Korean Intellectual Property Office, the disclosure of each of which is incorporated by reference herein in its entirety.

TECHNICAL FIELD

The disclosure relates to a wearable electronic device including a rigid flexible printed circuit board.

BACKGROUND ART

A wearable electronic device, such as a smart watch, may include a metal frame that forms an exterior and electronic circuits for obtaining various information through the metal frame. The electronic circuits may include, for example, a biometric sensor that detects biometric information through an electrode installed in the metal frame, or an acoustic sensor that receives sound through a duct formed in the metal frame. The electronic circuits may be located adjacent to the metal frame to obtain external information through the metal frame. For example, the electronic circuits may be disposed on a printed circuit board adjacent to the metal frame.

Meanwhile, the metal frame may be used as an antenna for transmitting and receiving a wireless signal. The printed circuit board adjacent to the metal frame may affect antenna performance.

The above-information is presented as background information only to assist with an understanding of the disclosure. No determination has been made, and no assertion is made, as to whether any of the above might be applicable to a prior art with regard to the disclosure.

DISCLOSURE

Technical Solution

Aspects of the disclosure are to address at least the above-mentioned problems and/or disadvantages and to provide at least the advantages described below. Accordingly, an aspect of the disclosure is to provide a wearable electronic device including a rigid flexible printed circuit board.

Additional aspects will be set forth in part in the description which follows and, in part, will be apparent from the description, or may be learned by practice of the presented embodiments.

In accordance with an aspect of the disclosure, a wearable electronic device is provided. The wearable electronic device includes a housing including a metal frame, a display within the housing, a bracket within the housing, including a side surface facing an inner surface of the metal frame, a rigid flexible printed circuit board including a rigid portion located between the inner surface of the metal frame and the side surface of the bracket, and an electronic circuitry on the rigid portion, and wherein the rigid portion includes a first portion under the electronic circuitry, and a second portion extending from a portion of the first portion toward the display and disposed on the side surface of the bracket so that the rigid portion is supported by the bracket, and wherein the second portion includes a non-conductive portion arranged with respect to a slot between the metal frame and a portion of the display, the slot used to radiate a signal to an external electronic device.

In accordance with another aspect of the disclosure, a wearable electronic device is provided. The electronic device includes a housing including a metal frame, a display panel in the housing, a slot antenna at least partially formed by a gap between the metal frame and the display panel, and a rigid flexible printed circuit board including a rigid portion on which an electronic circuitry is disposed and a plurality of conductive traces crossing the rigid portion. An upper end portion of the rigid portion facing the gap is formed as a fill-cut region that does not contain a conductive material. The plurality of conductive traces of the rigid portion is formed between a lower end portion of the rigid portion and the fill-cut region. The plurality of conductive traces protrude in a direction from the upper end portion of the rigid portion toward the lower end portion such that an area of the fill-cut region is widened. The slot antenna radiates radio waves using the gap extended by the fill-cut region. Through this, performance of the slot antenna is improved.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors.

The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth$^T$M chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
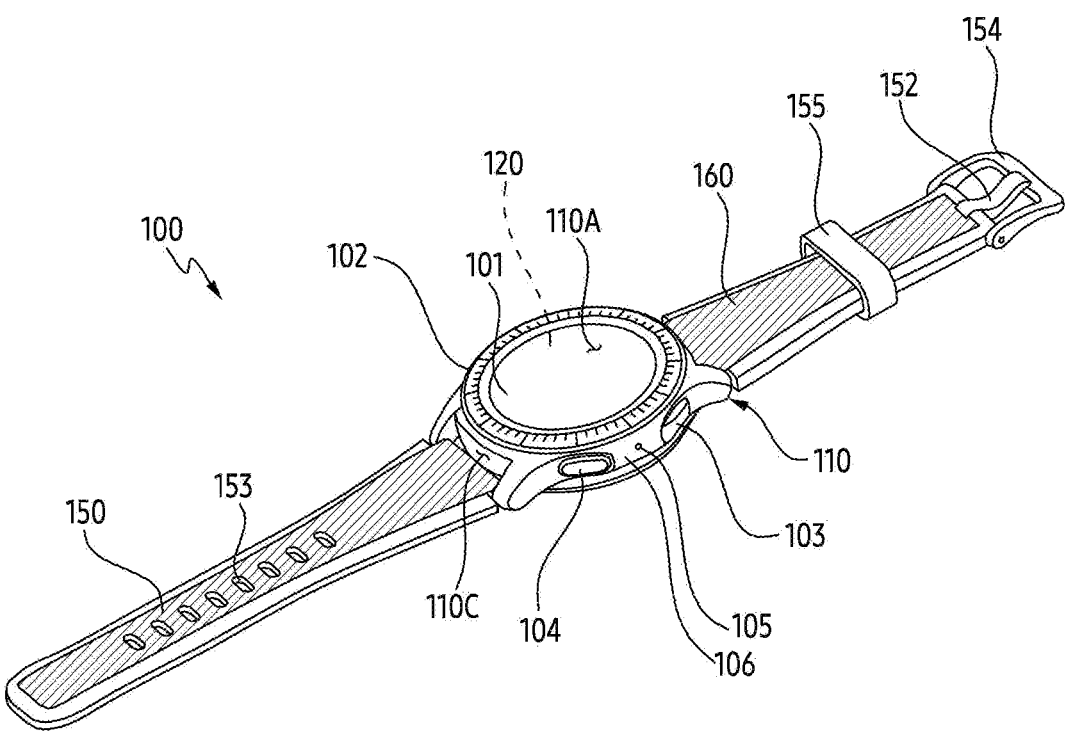
FIG. 1 is a front perspective view of an electronic device according to an embodiment of the disclosure.

FIG. 1 is a front perspective view of an electronic device according to an embodiment of the disclosure.

Figure 2:
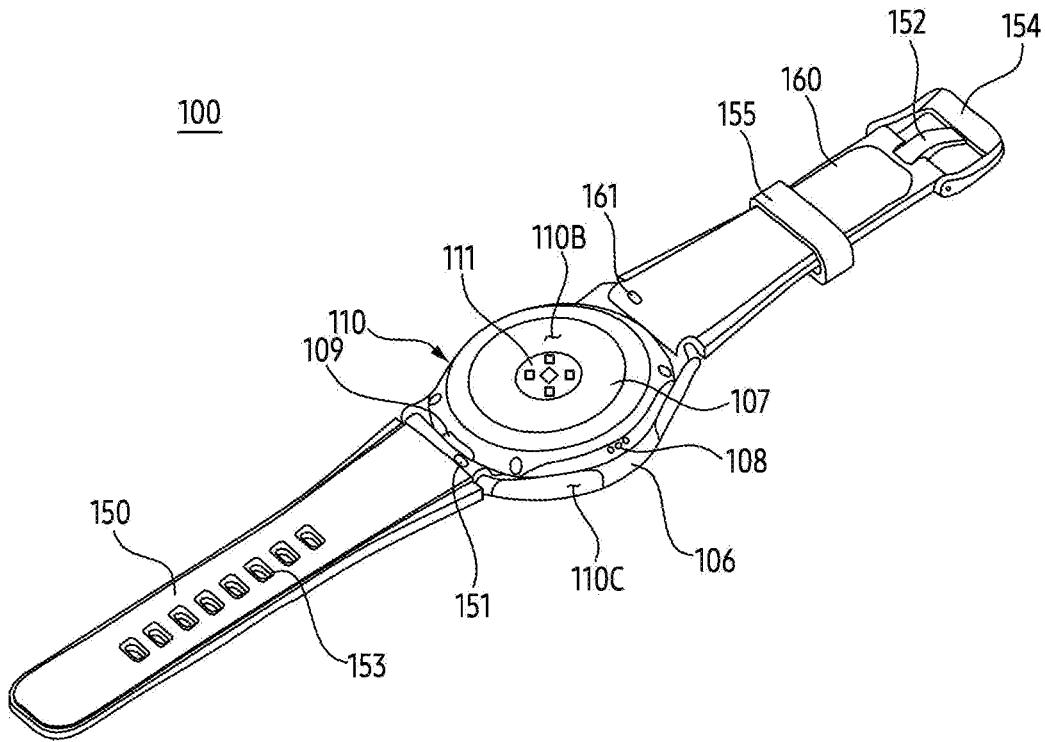
FIG. 2 is a rear perspective view of an electronic device according to an embodiment of the disclosure.

FIG. 2 is a rear perspective view of an electronic device according to an embodiment of the disclosure.

Referring to FIGS. 1 and 2, an electronic device 100 (e.g., an electronic device 1701 of FIG. 17) according to an embodiment may include a front surface 110A, a rear surface 110B, a housing 110 forming a side surface 110C surrounding a space between the front surface 110A and the rear surface 110B, fastening members 150 and 160 connected to at least a portion of the housing 110 and configured to detachably fasten the electronic device 100 to a portion (e.g., wrist, and the like) of the user's body. The electronic device 100 may be referred to as a wearable electronic device.

The housing 110 may refer to a structure forming at least some of the front surface 110A, the rear surface 110B, and the side surface 110C. In an embodiment of the disclosure, the front surface 110A may be formed by a front plate 101 (e.g., a glass plate including various coating layers, or a polymer plate), at least a portion of which is formed to be substantially transparent. The rear surface 110B may be formed by a substantially opaque rear plate 107. The rear plate 107 may be formed by, for example, coating or colored glass, ceramic, polymer, metal (e.g., aluminum, stainless steel (STS), or magnesium), or a combination of at least two of the above materials. The side surface 110C may be formed by a frame 106 coupled to the front plate 101 and the rear plate 107. The frame 106 may be formed of metal. The frame 106 may be referred to as a 'metal frame', a 'side surface member', or a 'side surface bezel structure'.

The fastening members 150 and 160 may be formed of various materials and shapes. For example, the fastening members 150 and 160 may be formed of fabric, leather, rubber, urethane, metal, ceramic, or a combination of at least two of the above materials so that one unit or a plurality of unit links may flow with each other.

Figure 17:
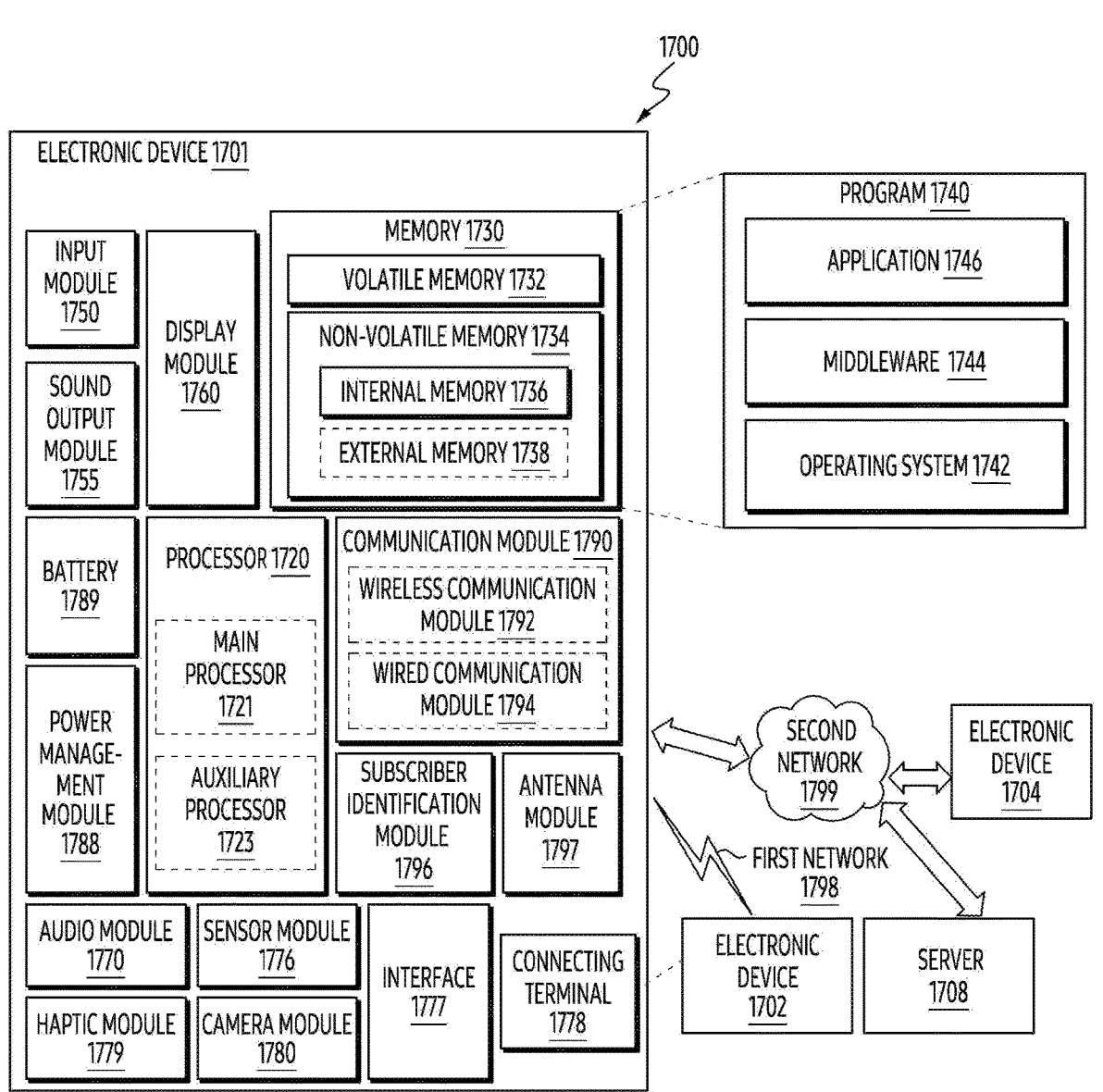
FIG. 17 is a block diagram illustrating an electronic device in a network environment according to an embodiment of the disclosure.

According to an embodiment of the disclosure, the electronic device 100 may include at least one of a display 120, an audio module (e.g., a sound output module 1755 and/or an audio module 1770 of FIG. 17), a sensor module 111, key input devices 102, 103, and 104, and a connector hole 109. In some embodiments of the disclosure, the electronic device 100 may omit or additionally include at least one of the components (e.g., the key input devices 102, 103, and 104, the connector hole 109, or the sensor module 111).

The display 120 may be exposed, for example, through a significant portion of the front plate 101. A shape of the display 120 may be a shape corresponding to a shape of the front plate 101 and may be various shapes, such as a circle, an ellipse, or a polygon. The display 120 may be coupled to or disposed adjacent to a touch sensing circuit, a pressure sensor capable of measuring intensity (pressure) of a touch, and/or a fingerprint sensor.

The audio module may include a microphone hole 105 (e.g., a first duct 410b and a second duct 410c of FIG. 8), and a speaker hole 108. A microphone (e.g., a first electronic circuit 531 of FIG. 8) for obtaining an external sound may be disposed inside the microphone hole 105. The microphone may include a plurality of microphones to be capable of detecting a direction of sound, but is not limited thereto. The speaker hole 108 may be used as an external speaker and a receiver for calls. In some embodiments of the disclosure, the speaker hole 108 may be integrated into the microphone hole 105 so that the speaker hole 108 and the microphone hole 105 may be implemented as a single hole, or a speaker may be included without the speaker hole 108 (e.g., a piezo speaker).

The sensor module 111 may generate an electrical signal or data value corresponding to an internal operating state or an external environmental state of the electronic device 100. The sensor module 111 may include, for example, the sensor module 111 (e.g., a heart rate monitor (HRM) sensor) disposed on the rear surface 110B of the housing 110. The electronic device 100 may further include at least one of a sensor module not illustrated, for example, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The key input devices 102, 103, and 104 may include a wheel key 102 disposed on the front surface 110A of the housing 110 and rotatable in at least one direction and key buttons 102 and 103 (e.g., a first button 416 and a second button 417 of FIG. 4) disposed on the side surface 110C of the housing 110. The wheel key 102 may have a shape corresponding to the shape of the front plate 101. In another embodiment of the disclosure, the electronic device 100 may not include some or all of the above-mentioned key input devices 102, 103, and 104. For example, the electronic device 100 may not include the wheel key 102, and the wheel key 102 that is not included may be implemented in another form, such as a soft key on the display 120.

The connector hole 109 may accommodate a connector (e.g., a USB connector) for transmitting and receiving power and/or data with an external electronic device. The electronic device 100 may further include, for example, a connector cover (not illustrated) that covers at least a portion of the connector hole 109 and blocks external foreign substances from entering the connector hole. In another embodiment of the disclosure, the electronic device 100 may not include the connector hole 109, and in this case, the electronic device 100 may transmit and receive the power and/or the data with the external electronic device by using wireless communication.

The fastening members 150 and 160 may be detachably coupled to at least a portion of the housing 110 by using locking members 151 and 161. The fastening members 150 and 160 may include at least one of a fixing member 152, a fixing member fastening hole 153, a band guide member 154, and a band fixing ring 155.

The fixing member 152 may be configured to fix the housing 110 and the fastening members 150 and 160 to the portion (e.g., the wrist, and the like) of the user's body. The fixing member fastening hole 153, corresponding to the fixing member 152, may fix the housing 110 and the fastening members 150 and 160 to the portion of the user's body. The band guide member 154 is configured to limit a movement range of the fixing member 152 when the fixing member 152 is fastened to the fixing member fastening hole 153, so that the fastening members 150 and 160 may be in close contact with and bound to the portion of the user's body. The band fixing ring 155 may limit a movement range of the fastening members 150 and 160 in a state in which the fixing member 152 and the fixing member fastening hole 153 are fastened.

Figure 3:
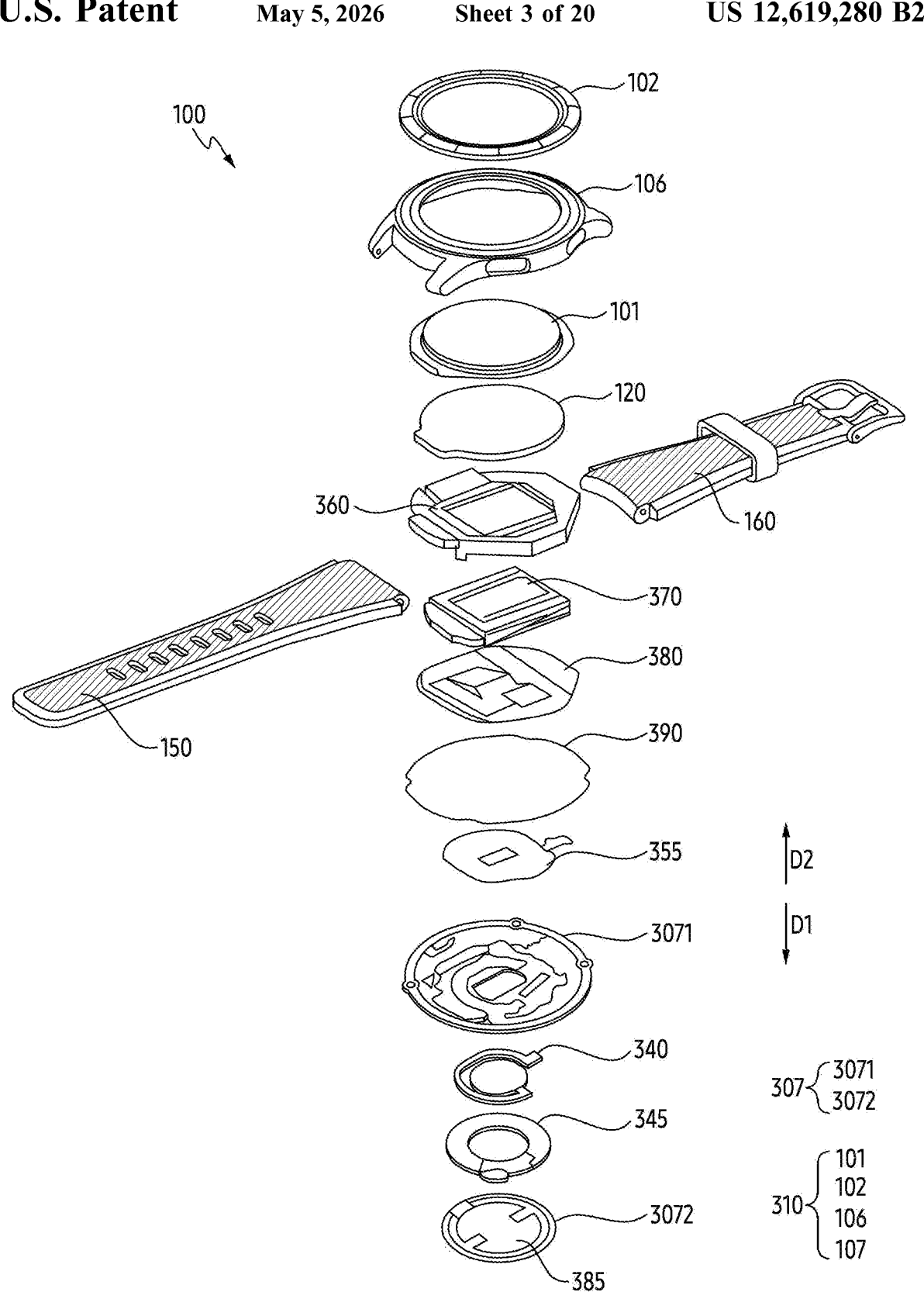
FIG. 3 is an exploded perspective view of an electronic device according to an embodiment of the disclosure.

FIG. 3 is an exploded perspective view of an electronic device 100 according to an embodiment of the disclosure.

An illustrated first direction D1 may be substantially perpendicular to a front plate 101, may be a direction from the front plate 101 toward a rear plate 307, and a second direction D2 may be a direction opposite to the first direction D1. Hereinafter, a redundant description for a configuration having the same reference numeral as the above-described configuration may be omitted.

Referring to FIG. 3, the electronic device 100 may include a housing 310, an antenna 355, a bracket 360, a battery 370, a printed circuit board 380, a sealing member 390, a wireless charging coil 345, a sensor module 340, and an optical film 385.

In an embodiment of the disclosure, the housing 310 (e.g., a housing 110 of FIGS. 1 and 2) may include a wheel key 102, the front plate 101, the rear plate 307, and a frame 106 that form an exterior (e.g., a front surface 110A, a rear surface 110B, and a side surface 110C of FIGS. 1 and 2) of the electronic device 100. In another embodiment of the disclosure, the housing 310 of the electronic device 100 may not include the wheel key 102, and in this case, the front surface of the electronic device 100 may be formed by the front plate 101, or the front plate 101 and the frame 106 may form the front surface together.

In an embodiment of the disclosure, the rear plate 307 (e.g., a rear plate 107 of FIGS. 1 and 2) may include a first plate 3071 and a second plate 3072. The second plate 3072 may be disposed under (e.g., the first direction D1) the first plate 3071. The first plate 3071 may be connected to the frame 106. The second plate 3072 may be connected to the first plate 3071 to close a hollow formed in the first plate 3071.

In an embodiment of the disclosure, the bracket 360 may be disposed inside the housing 310. For example, the bracket 360 may be disposed inside the frame 106. The bracket 360 may be located between the display 120 and the printed circuit board 380. For example, the display 120 may be disposed on one surface (e.g., a surface facing the second direction D2) of the bracket 360, and the printed circuit board 380 may be disposed on another surface (e.g., the surface facing the first direction D1). The bracket 360 may support the display 120 and the printed circuit board 380. The bracket 360 may be formed of a metal material and/or a non-metal (e.g., polymer) material.

In an embodiment of the disclosure, the printed circuit board 380 may be equipped with a processor (e.g., a processor 1720 of FIG. 17), memory (e.g., memory 1730 of FIG. 17), and/or an interface (e.g., an interface 1777 of FIG. 17). The processor may include, for example, one or more of a central processing unit, an application processor, a graphics processing unit (GPU), an application processor, a sensor processor, or a communication processor. The memory may include, for example, volatile memory or non-volatile memory. The interface may include, for example, a high definition multimedia interface (HDMI), a universal serial bus (USB) interface, a secure digital (SD) card interface, and/or an audio interface. The interface, for example, may electrically or physically connect the electronic device 100 to an external electronic device, and may include a USB connector, an SD card/multimedia card (MMC) connector, or an audio connector.

In an embodiment of the disclosure, the battery 370 is a device for supplying power to at least one component of the electronic device 100 and may include, for example, a rechargeable secondary battery. The battery 370 may be located between the bracket 360 and the printed circuit board 380, by being accommodated in a space formed in the bracket 360.

In an embodiment of the disclosure, the antenna 355 may be disposed between the printed circuit board 380 and the rear plate 307. The antenna 355 may include, for example, a near field communication (NFC) antenna, a wireless charging antenna, and/or a magnetic secure transmission (MST) antenna. For example, the antenna 355 may perform short-range communication with an external device, may wirelessly transmit and receive power required for charging, and may transmit a short-range communication signal or a self-based signal including payment data.

In an embodiment of the disclosure, the sealing member 390 may be interposed between the frame 106 and the first plate 3071 of the rear plate 307. The sealing member 390 may be configured to block moisture and a foreign substance flowed between the frame 106 and the first plate 3071 from outside.

In an embodiment of the disclosure, the wireless charging coil 345 configured to transmit and receive a power signal with the external device may be disposed between the first plate 3071 and the second plate 3072. A hollow that is aligned with the hollow formed in the first plate 3071 may be formed in the wireless charging coil 345.

In an embodiment of the disclosure, the sensor module 340 may be disposed between the first plate 3071 and the second plate 3072. The sensor module 340 may be disposed in a form that is at least partially accommodated in the hollow of the wireless charging coil 345. The sensor module 340 may at least partially face the second plate 3072. For example, the sensor module 340 may be disposed to face the second plate 3072. The sensor module 340 may detect the user's biometric information through the second plate 3072. For example, the sensor module 340 may include an optical sensor for detecting the user's heart rate and/or oxygen saturation in contact with the second plate 3072. In this case, the second plate 3072 may be formed of a material (e.g., a substantially transparent resin) capable of at least partially transmitting light, and the optical film 385 for improving an optical property of the sensor module 340 may be disposed between the second plate 3072 and the sensor module 340.

Figure 4:
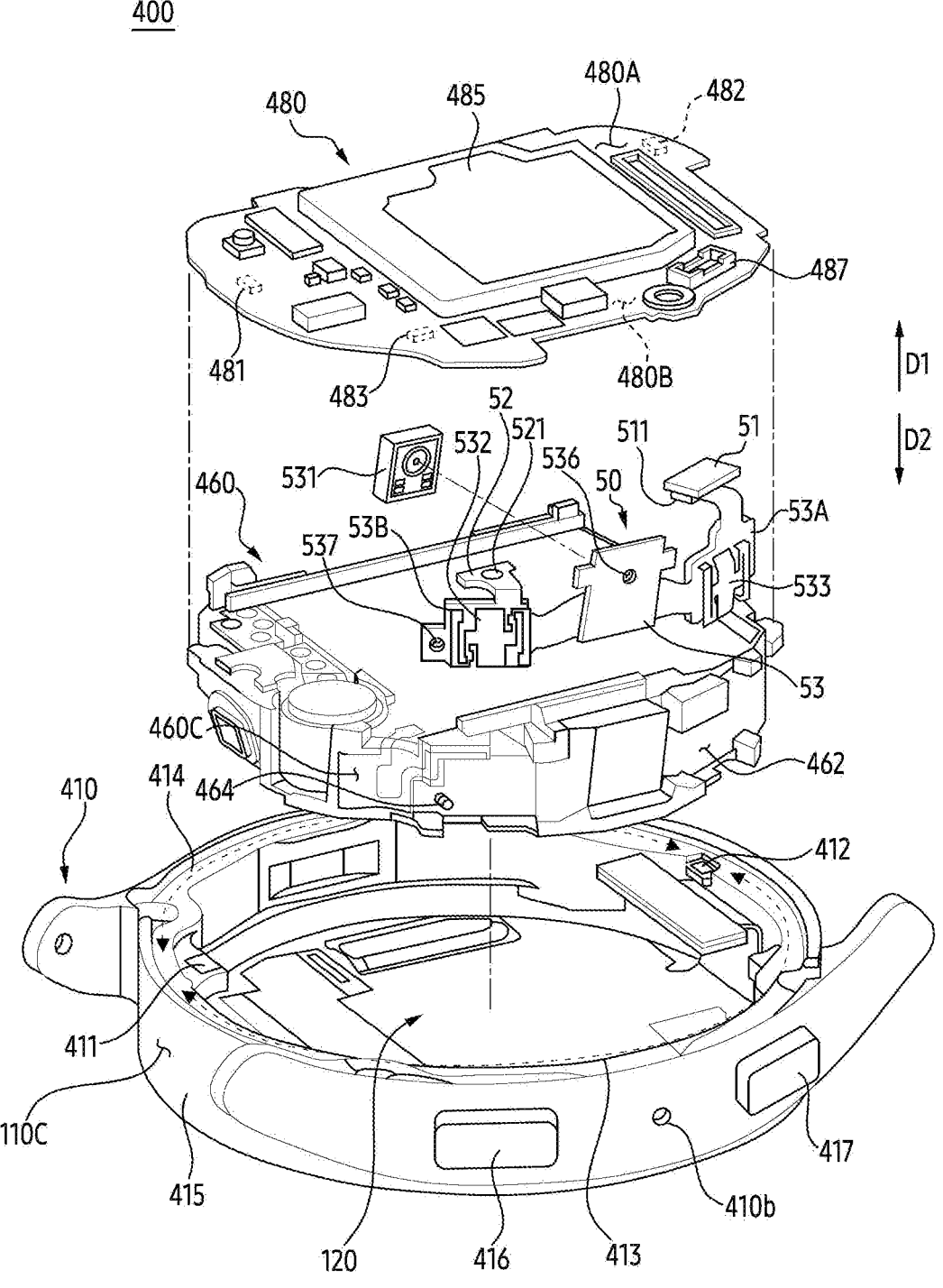
FIG. 4 is a perspective view of an electronic device according to an embodiment of the disclosure.
Figure 5:
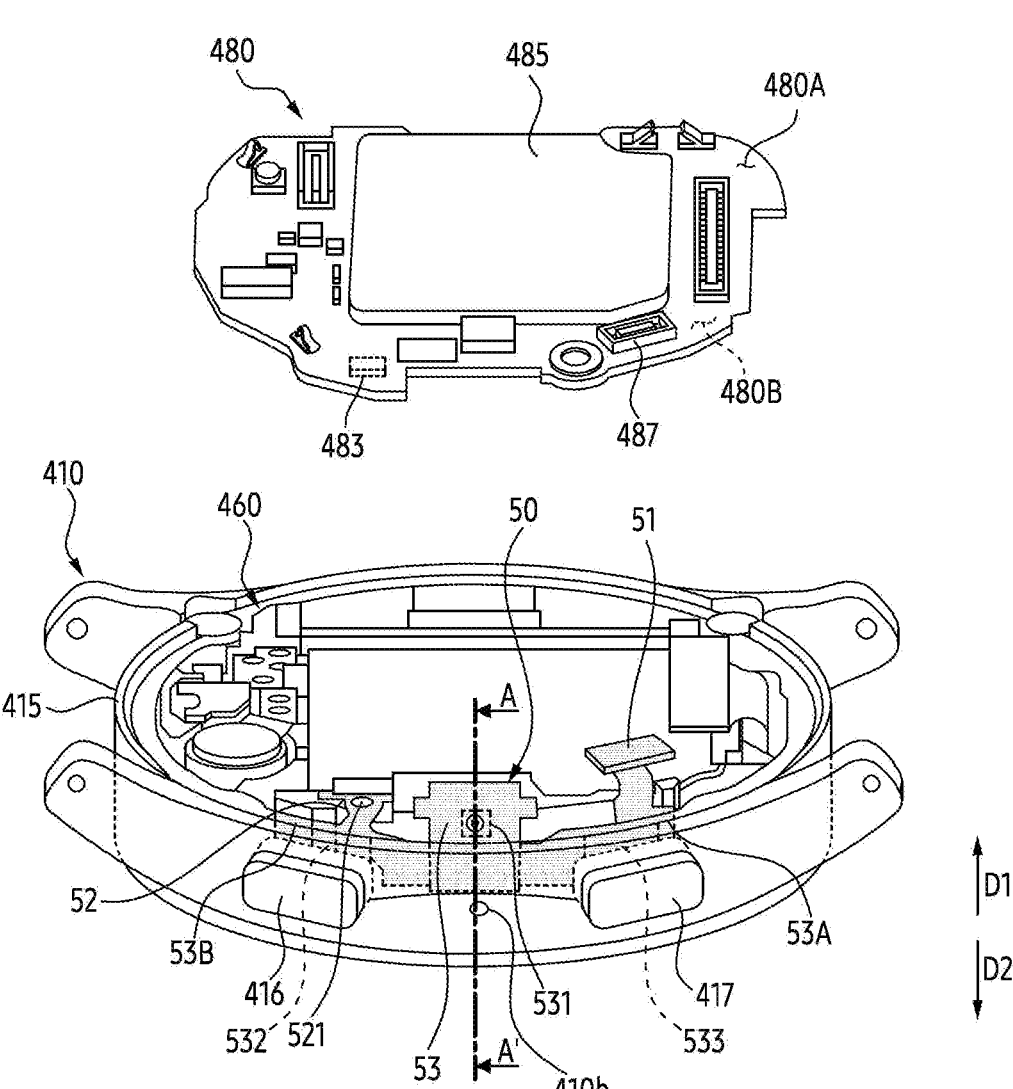
FIG. 5 is a perspective view of an electronic device according to an embodiment of the disclosure.

FIGS. 4 and 5 are perspective views of an electronic device according to various embodiments of the disclosure.

Figure 6:
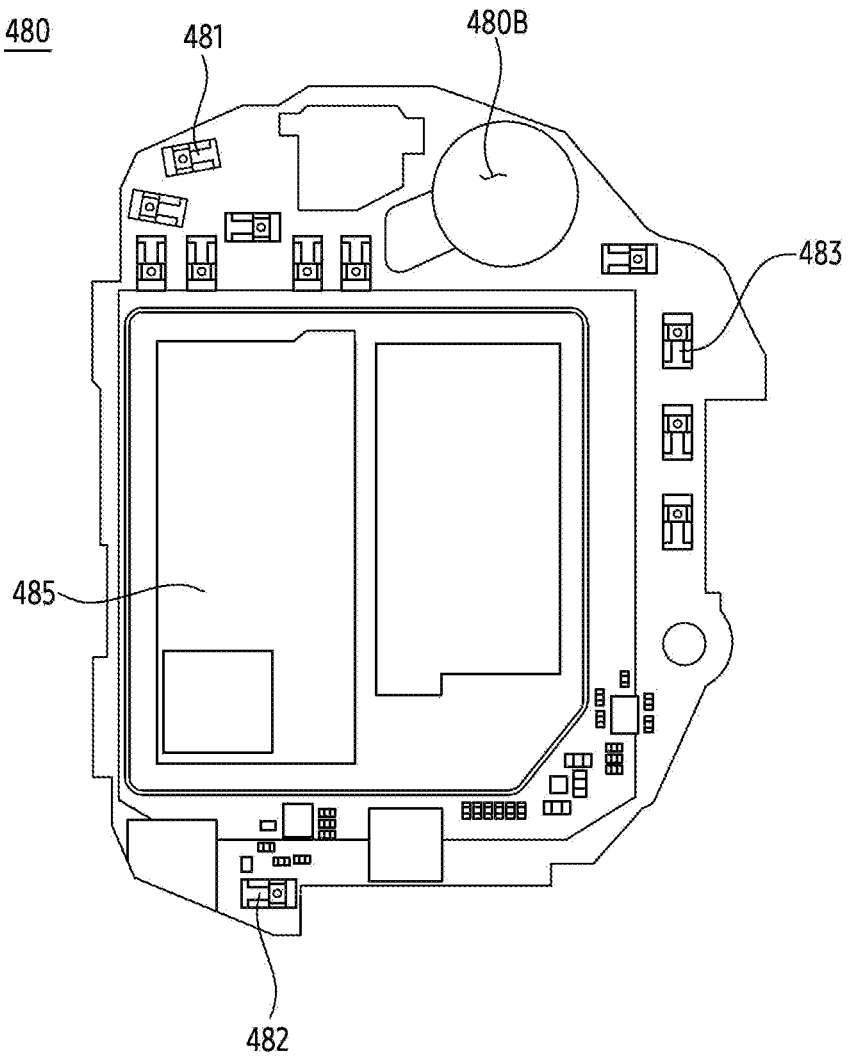
FIG. 6 is a diagram illustrating a printed circuit board according to an embodiment of the disclosure.

FIG. 6 is a diagram illustrating a printed circuit board 480 according to an embodiment of the disclosure.

Referring to FIGS. 4, 5, and 6, an electronic device 400 (e.g., an electronic device 100 of FIG. 3) according to an embodiment may include the printed circuit board 480, a bracket 460, a frame 410, a flexible printed circuit board 50, a first button 416, and a second button 417.

In an embodiment of the disclosure, the printed circuit board 480 (e.g., a printed circuit board 380 of FIG. 3) may include a first surface 480A and a second surface 480B facing in a direction opposite to the first surface 480A. For example, the first surface 480A of the printed circuit board 480 may face a first direction D1, and the second surface 480B may face a second direction D2 opposite to the first direction D1.

In an embodiment of the disclosure, various electronic circuits or electronic components may be disposed on the first surface 480A and/or the second surface 480B of the printed circuit board 480. A protection member 485 that protects the electronic components disposed on the printed circuit board 480 may be disposed on the first surface 480A and/or the second surface 480B of the printed circuit board 480. For example, the protection member 485 may include a shield can disposed on the printed circuit board 480 to cover the electronic component. For another example, the protection member 485 may include an insulating member (e.g., resin) covering the electronic component to protect it from an external environment and a conductive layer (e.g., conformal shielding) formed on the surface of the insulating member to shield electromagnetic interference (EMI).

In an embodiment of the disclosure, the printed circuit board 480 may be disposed on the bracket 460 (e.g., the first direction D1). The second surface 480B of the printed circuit board 480 may be supported by the bracket 460.

In an embodiment of the disclosure, the frame 410 (e.g., a frame 106 of a housing 310 of FIG. 3) may include a sidewall 415 forming at least a portion of a side surface 110C of the electronic device 400. The sidewall 415 may extend in a height direction (e.g., the first direction D1) of the electronic device 400 so as to surround a periphery of the bracket 460. When the frame 410 is viewed from above (e.g., when viewed in the second direction D2), a shape of the sidewall 415 may be substantially a circle, but is not limited thereto. For example, the sidewall 415 may have various shapes, such as a rectangle, a rectangle with round corners, or a polygon. The sidewall 415 of the frame 410 may be formed of metal and may have a loop shape that is not physically separated by another member (e.g., a non-conductive member).

In an embodiment of the disclosure, the frame 410 may include a first point 411 and a second point 412 formed on the sidewall 415 or formed on a portion of the frame 410 that protrudes inward from the sidewall 415.

In an embodiment of the disclosure, the sidewall 415 of the frame 410 may include a first portion 413 extending from the first point 411 to the second point 412 in one direction (e.g., counterclockwise) and having a first length and a second portion 414 extending from the first point 411 to the second point 412 in a direction (e.g., clockwise) different from the one direction and having a second length shorter than the first length.

In an embodiment of the disclosure, the frame 410 may be used as an antenna of the electronic device 400. For example, the frame 410 may radiate radio waves by feeding power at the first point 411 and being grounded at the second point 412. The electronic device 400 may transmit a wireless signal (e.g., a radio frequency (RF) signal) to an external device (e.g., an electronic device 1702 and/or an electronic device 1704 of FIG. 17) through the frame 410, or may receive a wireless signal from the external device.

In an embodiment of the disclosure, the first point 411 of the frame 410 may be connected to a first connector 481 disposed on the second surface 480B of the printed circuit board 480. For example, the first point 411 of the frame 410 may be in contact with the first connector 481. The first connector 481 may include, for example, a c-clip connector, but is not limited thereto. In an embodiment of the disclosure, a wireless communication circuit (e.g., a wireless communication circuit 1792 of FIG. 17) disposed on the printed circuit board 480 may be electrically connected to the first point 411 of the frame 410 through a transmission line formed on the printed circuit board 480 and the first connector 481 electrically connected to the transmission line. The wireless communication circuit may transmit and receive the wireless signal by feeding power to the first point 411 of the frame 410.

In an embodiment of the disclosure, the second point 412 of the frame 410 may be connected to a second connector 482 disposed on the second surface 480B of the printed circuit board 480. For example, the second point 412 of the frame 410 may be in contact with the second connector 482. The second connector 482 may include, for example, the c-clip connector, but is not limited thereto. The second point 412 of the frame 410 may be electrically connected to a ground (or ground plane) of the printed circuit board 480 through the second connector 482. The ground may include a conductive layer or a conductive region of the printed circuit board 480 formed of a conductive material (e.g., copper). The ground may be formed as one or a plurality of regions on one or a plurality of layers of the printed circuit board 480. In this respect, the ground of the printed circuit board 480 may be referred to as at least one ground.

In an embodiment of the disclosure, the bracket 460 (e.g., the bracket 360 of FIG. 3) may be at least partially accommodated in a space formed by the frame 410. For example, the bracket 460 may be disposed in the sidewall 415 of the frame 410. In an embodiment of the disclosure, the bracket 460 may be at least partially spaced apart from the sidewall 415 of the frame 410. For example, the bracket 460 may include a side surface 460C facing the sidewall 415, and the side surface 460C of the bracket 460 may be at least partially spaced apart from the sidewall 415.

In an embodiment of the disclosure, the bracket 460 may support the flexible printed circuit board 50. For example, the flexible printed circuit board 50 may be supported by the side surface 460C of the bracket 460.

In an embodiment of the disclosure, the flexible printed circuit board 50 may include a flexible printed circuit board or a rigid flexible printed circuit board in which at least a portion may be bent.

In an embodiment of the disclosure, the flexible printed circuit board 50 may be disposed at least partially between the bracket 460 and the sidewall 415. For example, the flexible printed circuit board 50 may be partially seated in a receiving groove 462 formed on the side surface 460C of the bracket 460.

In an embodiment of the disclosure, the flexible printed circuit board 50 may be fixedly disposed on the side surface 460C of the bracket 460. For example, the flexible printed circuit board 50 may be coupled to the bracket 460 in a manner in which a protrusion 464 formed in the receiving groove 462 and a hole 537 formed in the flexible printed circuit board 50 are fitted and coupled, but is not limited thereto. Additionally or alternatively, the flexible printed circuit board 50 may be coupled to the bracket 460 through an adhesive member (e.g., double-sided tape) or a fixing member (e.g., screw).

In an embodiment of the disclosure, the flexible printed circuit board 50 may at least partially overlap the sidewall 415 and/or the bracket 460 of the frame 410 when viewing a side surface of the electronic device 400 (e.g., when viewing in a direction perpendicular to the first direction D1).

In an embodiment of the disclosure, the flexible printed circuit board 50 may be located between the first portion 413 of the frame 410 and the bracket 460. For example, the flexible printed circuit board 50 may be more adjacent to the first portion 413 than the second portion 414 of the frame 410. However, it is not limited thereto, and unlike the illustration, the flexible printed circuit board 50 may be located between the second portion 414 of the frame 410 and the bracket 460.

In an embodiment of the disclosure, the flexible printed circuit board 50 may include a first connection portion 51, a second connection portion 52, and an extension portion 53. The extension portion 53 may be located between the bracket 460 and the sidewall 415. The extension portion 53 may extend between the bracket 460 and the sidewall 415. For example, the extension portion 53 may extend along the sidewall 415 (or the side surface 460C of the bracket 460) of the frame 410. The extension portion 53 may be at least partially accommodated in the receiving groove 462 of the bracket 460.

In an embodiment of the disclosure, a first end 53A of the extension portion 53 may be located between the second button 417 and the bracket 460, and a second end 53B may be located between the first button 416 and the bracket 460.

In an embodiment of the disclosure, the first button 416 and the second button 417 may be at least partially exposed through the frame 410. In an embodiment of the disclosure, the first button 416 and the second button 417 may at least partially overlap the extension portion 53 of the flexible printed circuit board 50 when viewing the side surface 110C of the frame 410 (e.g., when viewing in the direction perpendicular to the first direction D1).

The electronic device 400 according to an embodiment may include a first electronic circuit 531, a second electronic circuit 532, and a third electronic circuit 533 disposed in the extension portion 53.

In an embodiment of the disclosure, the first electronic circuit 531 may be located between the second electronic circuit 532 and the third electronic circuit 533 in the extension portion 53. The first electronic circuit 531 may be located between the extension portion 53 and the bracket 460. The first electronic circuit 531 may include a sensor circuit (e.g., a microphone) set to detect sound. The first electronic circuit 531 may receive the sound through an opening 536 formed in the extension portion 53 and a first duct 410b penetrating the frame 410 to communicate (e.g., connected or connected such that fluid can flow) with the opening 536.

In an embodiment of the disclosure, the second electronic circuit 532 may be configured to generate an electrical signal based on a user input pressing the first button 416. For example, the second electronic circuit 532 may include a dome switch. Additionally or optionally, the second electronic circuit 532 may include a biometric sensor circuit. The biometric sensor circuit of the second electronic circuit 532 may be set to obtain biometric information of a user in contact with the first button 416 by being electrically connected to the first button 416 at least partially formed of the conductive material. The second electronic circuit 532 and the first button 416 may operate as an electrode for detecting the user's biometric information when the user's body contacts the first button 416.

In an embodiment of the disclosure, the third electronic circuit 533 may be configured to generate the electrical signal based on a user input pressing the second button 417. For example, the third electronic circuit 533 may include the dome switch. Additionally or optionally, the third electronic circuit 533 may include the biometric sensor circuit. The biometric sensor circuit of the third electronic circuit 533 may be set to obtain biometric information of a user in contact with the second button 417 by being electrically connected to the second button 417 at least partially formed of the conductive material. The third electronic circuit 533 and the second button 417 may operate as the electrode for detecting the user's biometric information when the user's body contacts the second button 417.

In an embodiment of the disclosure, a signal detected by the second electronic circuit 532 and/or the third electronic circuit 533 may be transmitted to a processor (e.g., a processor 1720 of FIG. 17) through the flexible printed circuit board 50. The processor may obtain the user's biometric information based on the detected signal. The biometric information may include, for example, the user's electrocardiogram information and information on components of the user's body, but is not limited thereto.

In an embodiment of the disclosure, the first electronic circuit 531, the second electronic circuit 532, and the third electronic circuit 533 described above are not limited by the example described above, and may be configured to have a function different from those described above.

In an embodiment of the disclosure, the first connection portion 51 of the flexible printed circuit board 50 may extend from the first end 53A of the extension portion 53. For example, the first connection portion 51 of the flexible printed circuit board 50 may extend from the first end 53A of the extension portion 53 to face the first surface 480A of the printed circuit board 480.

In an embodiment of the disclosure, the first connection portion 51 of the flexible printed circuit board 50 may be disposed on the first surface 480A of the printed circuit board 480. For example, the first connection portion 51 may include a plug 511 of a connector, and a receptacle 487 of the connector may be disposed on the first surface 480A of the printed circuit board 480. In a manner in which the plug 511 and the receptacle 487 are coupled to each other, the first connection portion 51 may be connected to the first surface 480A of the printed circuit board 480. However, in order for the flexible printed circuit board 50 to be connected to the printed circuit board 480, it is not limited to the connector structure consisting of above-described the receptacle-plug. Unlike the illustration, the first connection portion 51 may be disposed on the second surface 480B of the printed circuit board 480.

In an embodiment of the disclosure, at least one processor (e.g., the processor 1720 and a communication module 1790 of FIG. 17) disposed on the printed circuit board 480 may be operatively connected to the first electronic circuit 531, the second electronic circuit 532, and the third electronic circuit 533 through the flexible printed circuit board 50. For example, the at least one processor may be communicatively coupled with the first electronic circuit 531, the second electronic circuit 532, and the third electronic circuit 533 through the printed circuit board 480 and the flexible printed circuit board 50. For example, the at least one processor may be electrically connected to the first electronic circuit 531, the second electronic circuit 532, and the third electronic circuit 533 through a conductive trace (or a conductive pattern) formed on the printed circuit board 480 and the flexible printed circuit board 50.

In an embodiment of the disclosure, the second connection portion 52 of the flexible printed circuit board 50 may extend from the second end 53B of the extension portion 53. For example, the second connection portion 52 of the flexible printed circuit board 50 may extend from the second end 53B of the extension portion 53 to face the second surface 480B of the printed circuit board 480.

In an embodiment of the disclosure, the second connection portion 52 may be disposed on the second surface 480B of the printed circuit board 480. A conductive region 521 (or a conductive pad) in which the conductive pattern of the flexible printed circuit board 50 is partially exposed may be formed in the second connection portion 52. The conductive region 521 may face the second surface 480B of the printed circuit board 480. The conductive region 521 may be in contact with a third connector 483. The conductive region 521 may be electrically connected to the ground of the printed circuit board 480 through the third connector 483. In an embodiment of the disclosure, the third connector 483 may include, for example, a c-clip, but is not limited thereto. Unlike the illustration, the second connection portion 52 of the flexible printed circuit board 50 may be disposed on the first surface 480A of the printed circuit board 480, and the conductive region 521 may be electrically connected to the ground of the printed circuit board 480 through the connector disposed on the first surface 480A.

In an embodiment of the disclosure, the flexible printed circuit board 50 may include a plurality of conductive traces (or conductive patterns). The plurality of conductive traces may include signal lines, power lines, and ground lines associated with the first electronic circuit 531, the second electronic circuit 532, and the third electronic circuit 533. In an embodiment of the disclosure, at least some of the ground lines may be electrically connected to the conductive region 521 of the second connection portion 52, directly or indirectly (e.g., through another ground line). The ground lines may be electrically connected to the ground of the printed circuit board 480 through the conductive region 521 of the second connection portion 52.

Figure 7:
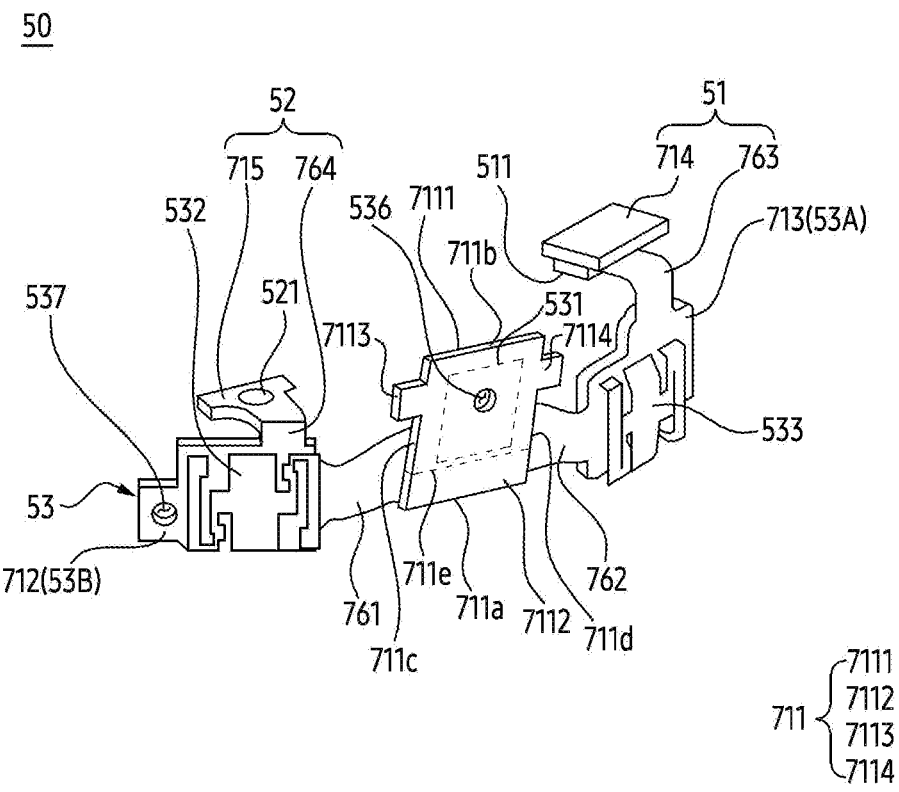
FIG. 7 is a diagram illustrating a flexible printed circuit board according to an embodiment of the disclosure.

FIG. 7 is a diagram illustrating a flexible printed circuit board according to an embodiment of the disclosure.

Referring to FIG. 7, a flexible printed circuit board 50 according to an embodiment may include flexible portion(s) and rigid portion(s). For example, the flexible printed circuit board 50 may include a first rigid portion 711, a second rigid portion 712, a third rigid portion 713, a fourth rigid portion 714, a fifth rigid portion 715, a first flexible portion 761, a second flexible portion 762, a third flexible portion 763, and a fourth flexible portion 764.

In an embodiment of the disclosure, the first rigid portion 711, the second rigid portion 712, the third rigid portion 713, the first flexible portion 761, and the second flexible portion 762 may be included in an extension portion 53. At least a portion of the second rigid portion 712 may be included in a second end 53B. At least a portion of the third rigid portion 713 may be included in a first end 53A. The fourth rigid portion 714 and the third flexible portion 763 may be included in a first connection portion 51. The fifth rigid portion 715 and the fourth flexible portion 764 may be included in a second connection portion 52.

In an embodiment of the disclosure, the first rigid portion 711 may include a first portion 7111 and a second portion 7112. A first electronic circuit 531 may be disposed on the first portion 7111. An opening 536 penetrating the first portion 7111 may be formed in the first portion 7111 to transmit sound to the first electronic circuit 531. The second portion 7112 may extend from the first portion 7111. For example, the second portion 7112 may extend from a portion 711e of the first portion 7111. The second portion 7112 may not overlap the first electronic circuit 531 on the first portion 7111. For example, the first electronic circuit 531 may not be located on the second portion 7112. Alternatively, the first rigid portion 711 may be formed to be flexible. The first rigid portion 711 may be referred to as a part of the flexible printed circuit board 50 on which the first electronic circuit 531 is disposed. In this case, the part of the flexible printed circuit board 50 may include a first portion 7111 overlapping the first electronic circuit 531, and the second portion 7112 extending from the first portion 7111 but not overlapping the first electronic circuit 531.

In an embodiment of the disclosure, the first rigid portion 711 may include a first edge 711*a*, a second edge 711*b* facing the first edge 711*a*, a third edge 711*c*, and a fourth edge 711*d* facing the third edge 711*c*. The third edge 711*c* may be connected from one end of the first edge 711*a* to one end of the second edge 711*b*. The fourth edge 711*d* may be connected from another end of the first edge 711*a* to another end of the second edge 711*b*. The first edge 711*a* may be substantially parallel to the second edge 711*b*, but is not limited thereto. The third edge 711*c* may be perpendicular to the first edge 711*a* and/or the second edge 711*b*, but is not limited thereto. The fourth edge 711*d* may be perpendicular to the first edge 711*a* and/or the second edge 711*b*, but is not limited thereto.

In an embodiment of the disclosure, the second portion 7112 of the first rigid portion 711 may form the first edge 711*a*, by extending from the first portion 7111. The second edge 711*b* may be formed by the first portion 7111. The third edge 711*c* may be formed by the first portion 7111 and the second portion 7112. The fourth edge 711*d* may be formed by the first portion 7111 and the second portion 7112.

In an embodiment of the disclosure, a first protrusion 7113 facing the second rigid portion 712 may be formed on the third edge 711*c* of the first portion 7111. A second protrusion 7114 facing the third rigid portion 713 may be formed on the fourth edge 711*d* of the first portion 7111. As the first protrusion 7113 and the second protrusion 7114 are caught in an receiving groove (462 of FIG. 4) formed in a bracket (460 of FIG. 4), the flexible printed circuit board 50 may be stably supported.

In an embodiment of the disclosure, a second electronic circuit 532 may be disposed on the second rigid portion 712. A third electronic circuit 533 may be disposed on the third rigid portion 713. A plug 511 may be disposed on the fourth rigid portion 714. A conductive region 521 may be formed on the fifth rigid portion 715.

In an embodiment of the disclosure, the first flexible portion 761 may connect the first rigid portion 711 and the second rigid portion 712. For example, the first flexible portion 761 may extend from the first rigid portion 711 to the second rigid portion 712. The first flexible portion 761 may extend from the third edge 711*c* of the first rigid portion 711. For example, the first flexible portion 761 may extend from the first portion 7111 and the second portion 7112, forming the third edge 711*c*, but is not limited thereto. Unlike the illustration, the first flexible portion 761 may extend only from the third edge 711*c* of the first portion 7111.

In an embodiment of the disclosure, the second flexible portion 762 may connect the first rigid portion 711 and the third rigid portion 713. For example, the second flexible portion 762 may extend from the first rigid portion 711 to the third rigid portion 713. The second flexible portion 762 may extend from the fourth edge 711*d* of the first rigid portion 711. For example, the second flexible portion 762 may extend from the first portion 7111 and the second portion 7112, forming the fourth edge 711*d*, but is not limited thereto. Unlike the illustration, the second flexible portion 762 may extend only from the fourth edge 711*d* of the first portion 7111.

In an embodiment of the disclosure, the third flexible portion 763 may connect the third rigid portion 713 and the fourth rigid portion 714. For example, the third flexible portion 763 may extend from the third rigid portion 713 to the fourth rigid portion 714.

In an embodiment of the disclosure, the fourth flexible portion 764 may connect the second rigid portion 712 and the fifth rigid portion 715. For example, the fourth flexible portion 764 may extend from the second rigid portion 712 to the fifth rigid portion 715.

For example, in case that the third electronic circuit 533 is omitted, the third rigid portion 713 may be replaced with the flexible portion.

Figure 8:
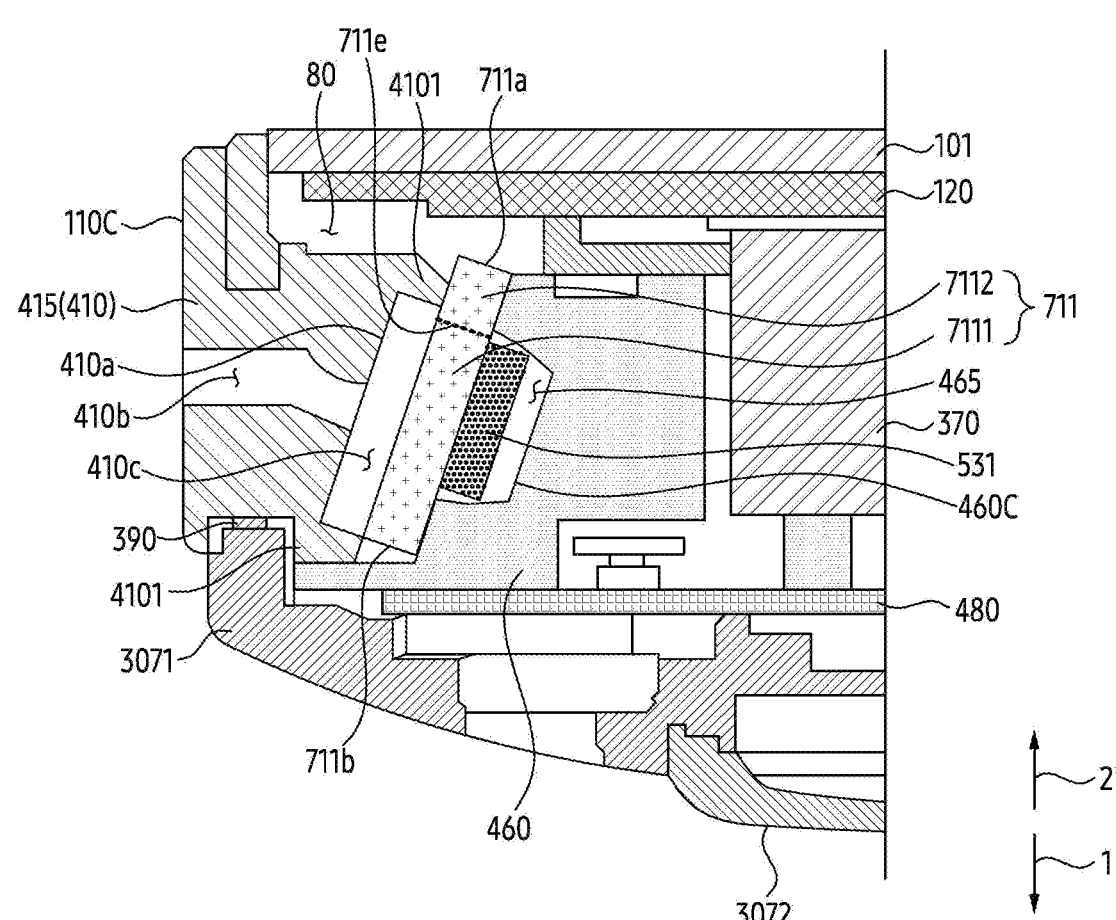
FIG. 8 is a diagram illustrating an electronic device according to an embodiment of the disclosure.

FIG. 8 is a diagram illustrating an electronic device according to an embodiment of the disclosure.

FIG. 8 may be a cross-sectional view cut along a line A-A' of FIG. 5.

Figure 9:
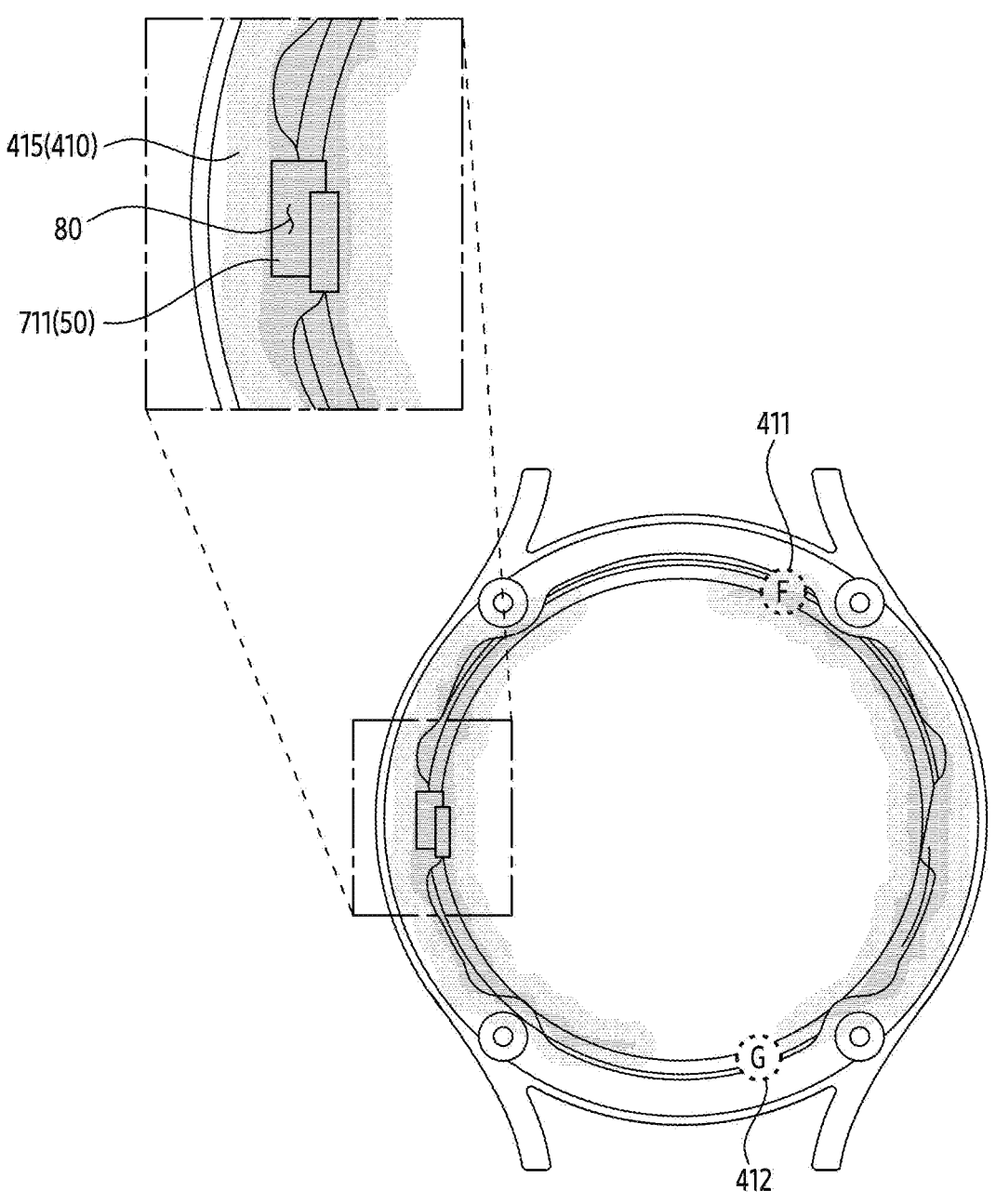
FIG. 9 is a diagram illustrating distribution of an electric field of an electronic device according to an embodiment of the disclosure.

FIG. 9 is a diagram illustrating distribution of an electric field of an electronic device according to an embodiment of the disclosure.

Referring to FIG. 8 together with FIG. 7, a bracket 460 according to an embodiment may include a side surface 460C facing a frame 410. For example, the side surface 460C of the bracket 460 may face an inner surface 410*a* of the frame 410. A first rigid portion 711 may be disposed in a space where the side surface 460C of the bracket 460 and the inner surface 410*a* of the frame 410 are spaced apart from each other.

In an embodiment of the disclosure, a recess 465 may be formed on the side surface 460C of the bracket 460. The recess 465 may be recessed in a direction away from the inner surface 410*a* of the frame 410. The first rigid portion 711 may be disposed on the side surface 460C of the bracket 460 to close the recess 465, and a first electronic circuit 531 on the first rigid portion 711 may be accommodated in the recess 465. A peripheral portion of the recess 465 may support the first rigid portion 711. For example, the side surface 460C of the peripheral portion of the recess 465 may support the first rigid portion 711. For example, a second portion 7112 of the first rigid portion 711 may be disposed and supported on the side surface 460C of the bracket 460.

In an embodiment of the disclosure, a first duct 410*b* penetrating a sidewall 415 may be formed in the frame 410. The first duct 410*b* may extend from a side surface 110C of the frame 410 to the inner surface 410*a*. In an embodiment of the disclosure, the frame 410 may include a portion 4101 that forms a second duct 410*c* by protruding from the inner surface 410*a*. The portion 4101 of the frame 410 may be supported by the second portion 7112 of the first rigid portion 711 and the bracket 460. The second duct 410*c* may communicate with the first duct 410*b*. The second duct 410*c* may be formed to have a diameter larger than that of the first duct 410*b*. The first electronic circuit 531 may receive sound through an opening (536 of FIG. 4) of the first duct 410*b*, the second duct 410*c*, and the first rigid portion 711. Although not illustrated, an acoustic member, such as a rubber for a reception characteristic (e.g., leakage prevention) of the sound may be disposed inside the second duct 410*c*, but is not limited thereto. Additionally or optionally, the acoustic member may be interposed between the portion 4101 of the frame 410 and the first rigid portion 711 (and/or bracket 460), but is not limited thereto. The first duct 410*b* or the second duct 410*c* may be referred to as an acoustic duct, a hole, a microphone hole, a pipeline, an acoustic path, a sound path, an acoustic channel, or a sound channel, but is not limited to thereto.

In an embodiment of the disclosure, the first rigid portion 711 may be disposed to be inclined. For example, the first rigid portion 711 may not be parallel to the display 120 and may not be parallel to a second direction D2 perpendicular to the display 120. For example, the first rigid portion 711 may be inclined so that the first edge 711*a* is located further inside the electronic device 400 (or the housing (310 of FIG. 3)) than the second edge 711*b*. For example, the first rigid portion 711 may be inclined so that the first edge 711*a* is closer to the battery 370 than the second edge 711*b*. For example, the first rigid portion 711 may be inclined so that the first edge 711*a* is located farther to the side surface 110C of the frame 410 than the second edge 711*b*. For example, the first rigid portion 711 may be inclined so that one surface facing the frame 410 faces a slot 80.

In an embodiment of the disclosure, the second portion 7112 of the first rigid portion 711 may extend from the first portion 7111 toward the display 120. For example, the second portion 7112 of the first rigid portion 711 may extend from the portion 711*e* of the first portion 7111 toward the display 120. The second portion 7112 may form the first edge 711*a* of the first rigid portion 711 facing the display 120.

In an embodiment of the disclosure, the display 120 may be spaced apart from the frame 410. As the display 120 and the frame 410 are spaced apart, the slot (or gap) 80 may be formed. The slot 80 may form a radiating element of an antenna that at least partially includes the frame 410. For example, referring to FIG. 9, an electric field of an antenna fed at a first point 411 of the frame 410 and grounded at a second point 412 may be formed strongest in the slot 80.

Referring back to FIG. 8, the second portion 7112 of the first rigid portion 711 may be arranged with respect to the slot 80. For example, the second portion 7112 of the first rigid portion 711 may be located adjacent to the slot 80. For example, the second portion 7112 of the first rigid portion 711 may be located at least partially in the slot 80. For example, the second portion 7112 of the first rigid portion 711 may overlap the slot 80 when viewing in a direction perpendicular to the first rigid portion 711. For example, the second portion 7112 of the first rigid portion 711 may be inclined to face the slot 80. For example, the second portion 7112 of the first rigid portion 711 may form the slot 80 together with the display 120 and the frame 410.

In case that a size of the display 120 increases to provide a wider screen to the user, a size of the slot 80 may decrease, thereby limiting radiation of the antenna. In addition, in case that the second portion 7112 includes a conductive material, the conductive material prevents radiation of the slot 80 operating as a radiation element of the antenna, thereby deteriorating performance of the antenna. The second portion 7112 may support the first rigid portion 711 in which the first electronic circuit 531 is disposed by being seated on the bracket 460, and may also support the portion 4101 of the frame 410 forming the second duct 410*c*. Therefore, it may be difficult to omit the second portion 7112 of the first rigid portion 711 adjacent to the slot 80.

According to an embodiment of the disclosure, the second portion 7112 among the first portion 7111 and the second portion 7112 of the first rigid portion 711 may include a non-conductive portion arranged with respect to the slot 80. In an embodiment of the disclosure, the second portion 7112 may include the non-conductive portion arranged with respect to the slot 80. The non-conductive portion may include a first non-conductive region 1111, a second non-conductive region 1112, a third non-conductive region 1113, and a fourth non-conductive region 1114, which will be described later. The non-conductive portion of the second portion 7112 may open the radiation of the antenna using the slot 80. For example, as the second portion 7112 of the first rigid portion 711 is formed of the non-conductive portion, an element (e.g., the conductive material) that interfere with radiation of the antenna using the slot 80 may be removed.

Accordingly, the performance (e.g., radiation efficiency) of the antenna using the slot 80 may be improved.

Figure 10:
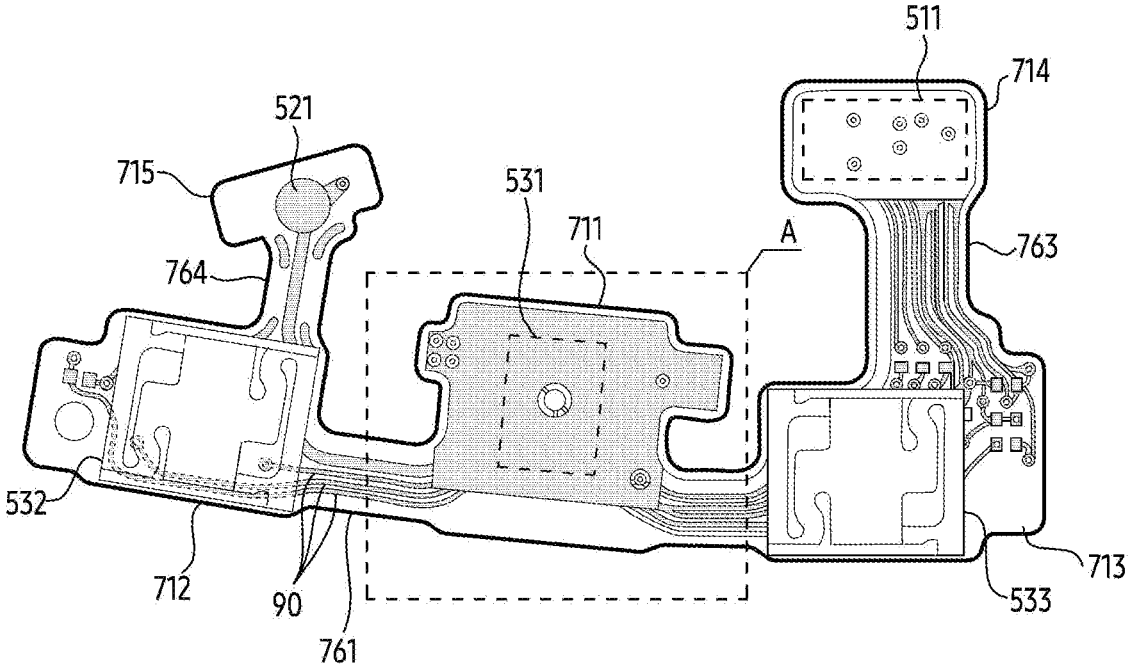
FIG. 10 is a diagram illustrating a flexible printed circuit board 50 according to an embodiment of the disclosure.

FIG. 10 is a diagram illustrating a flexible printed circuit board according to an embodiment of the disclosure.

Figure 11A:
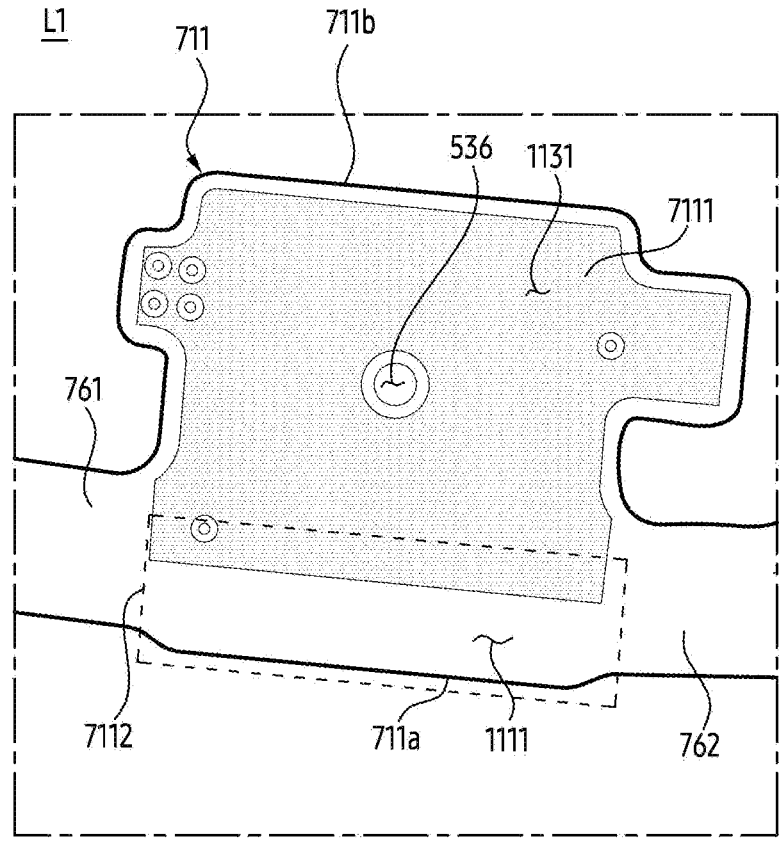
FIG. 11A is a diagram illustrating a first layer of a flexible printed circuit board 50 according to an embodiment of the disclosure.

FIG. 11A is a diagram illustrating a first layer L1 of a flexible printed circuit board according to an embodiment of the disclosure.

Figure 11B:
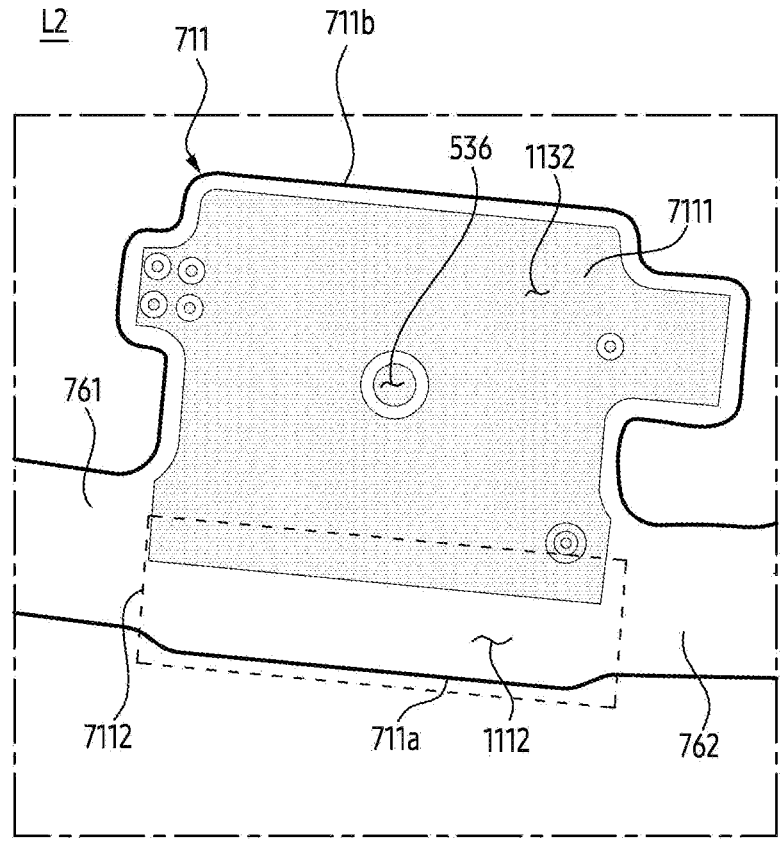
FIG. 11B is a diagram illustrating a second layer of a flexible printed circuit board 50 according to an embodiment of the disclosure.

FIG. 11B is a diagram illustrating a second layer L2 of a flexible printed circuit board according to an embodiment of the disclosure.

Figure 11C:
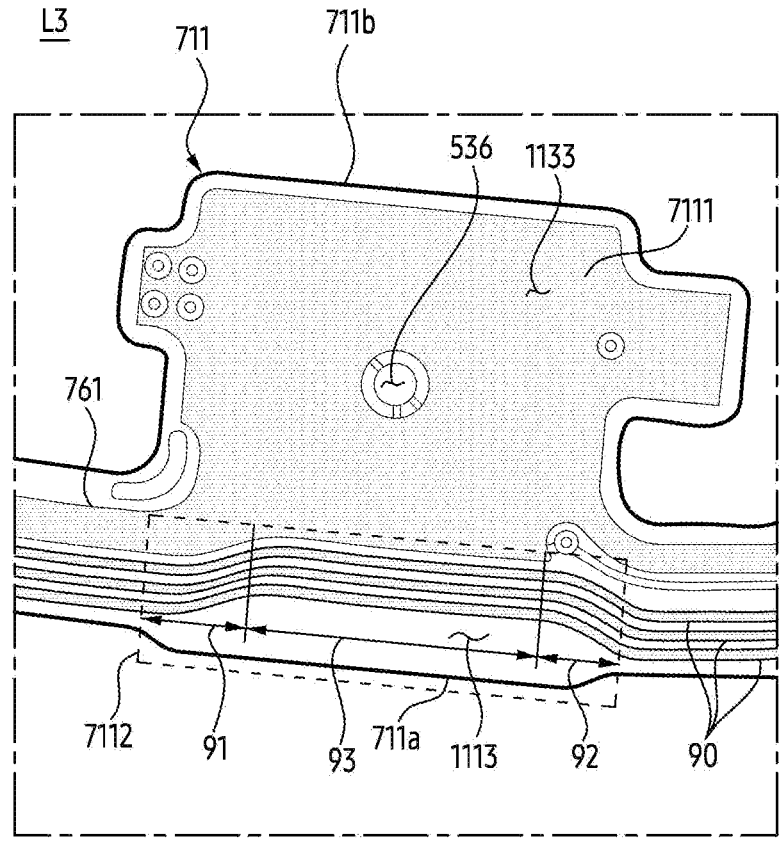
FIG. 11C is a diagram illustrating a third layer of a flexible printed circuit board 50 according to an embodiment of the disclosure.

FIG. 11C is a diagram illustrating a third layer L3 of a flexible printed circuit board according to an embodiment of the disclosure.

Figure 11D:
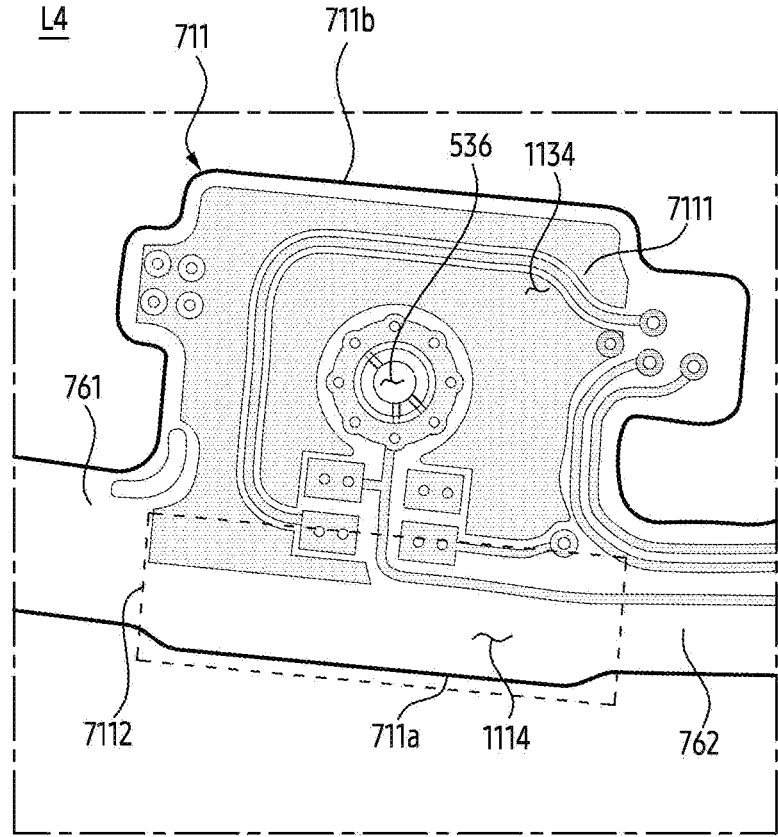
FIG. 11D is a diagram illustrating a fourth layer of a flexible printed circuit board 50 according to an embodiment of the disclosure.

FIG. 11D is a diagram illustrating a fourth layer L4 of a flexible printed circuit board according to an embodiment of the disclosure.

FIG. 10 indicates the flexible printed circuit board in which the first layer L1, the second layer L2, the third layer L3, and the fourth layer L4 are all projected. FIGS. 11A, 11B, 11C, and 11D indicate respective layers corresponding to a region A of FIG. 10.

Referring to FIGS. 11A, 11B, 11C, and 11D, in an embodiment of the disclosure, the flexible printed circuit board 50 may include a plurality of layers stacked on each other. For example, the flexible printed circuit board 50 may include the first layer L1, the second layer L2 on the first layer L1, the third layer L3 on the second layer L2, and the fourth layer L4 on the third layer L3. However, the order in which the first layer L1, the second layer L2, the third layer L3, and the fourth layer L4 are stacked is not limited thereto.

Referring to FIGS. 10 and 11A, a first portion 7111 of a first rigid portion 711 according to an embodiment may include a first conductive region 1131 formed on the first layer L1. A second portion 7112 of the first rigid portion 711 may include a first non-conductive region 1111 formed on the first layer L1. The first non-conductive region 1111 may extend from a first edge 711*a* of the first rigid portion 711 toward the first portion 7111. For example, the first non-conductive region 1111 may extend from the entire first edge 711*a* toward a second edge 711*b* opposite the first edge 711*a*.

Referring to FIGS. 10 and 11B, the first portion 7111 of the first rigid portion 711 according to an embodiment may include a second conductive region 1132 formed on the second layer L2. The second portion 7112 of the first rigid portion 711 may include a second non-conductive region 1112 formed in the second layer L2. The second non-conductive region 1112 may extend from the first edge 711*a* of the first rigid portion 711 toward the first portion 7111. For example, the second non-conductive region 1112 may extend from the entire first edge 711*a* toward the second edge 711*b* opposite the first edge 711*a*. When the first rigid portion 711 is viewed perpendicularly, the second non-conductive region 1112 may at least partially overlap the first non-conductive region 1111.

Referring to FIGS. 10 and 11C, the first portion 7111 of the first rigid portion 711 according to an embodiment may include a third conductive region 1133 formed on the third layer L3. The second portion 7112 of the first rigid portion 711 may include a third non-conductive region 1113 formed on the third layer L3. The third non-conductive region 1113 may extend from the first edge 711*a* of the first rigid portion 711 toward the first portion 7111. For example, the third non-conductive region 1113 may extend from the entire first edge 711*a* toward the second edge 711*b* opposite the first edge 711*a*. When the first rigid portion 711 is viewed perpendicularly, the third non-conductive region 1113 may at least partially overlap the first non-conductive region 1111 and the second non-conductive region 1112.

In an embodiment of the disclosure, the flexible printed circuit board 50 may include first conductive patterns 90. The first conductive patterns 90 may extend from a fourth rigid portion 714 to a second rigid portion 712. For example, the first conductive patterns 90 may extend to sequentially pass through a third flexible portion 763, a third rigid portion 713, a second flexible portion 762, the first rigid portion 711, and the first flexible portion 761. The first conductive patterns 90 may be electrically connected to a plug 511 and a second electronic circuit 532. The first conductive patterns 90 may electrically connect the second electronic circuit 532 to the plug 511. Signals related to an operation of the second electronic circuit 532, for example, a signal (e.g., a signal KEY1 of FIG. 15) generated by pressing a first button (416 of FIG. 5), a signal (e.g., a signal E1 of FIG. 15) indicating the user's biometric information in contact with the first button (416 of FIG. 5), and a ground signal (e.g., a signal GND of FIG. 15) may be transmitted through the first conductive patterns 90.

In an embodiment of the disclosure, the first conductive patterns 90 of the first rigid portion 711 may be formed between a non-conductive portion of the second portion 7112 and the first portion 7111. For example, the first conductive patterns 90 of the first rigid portion 711 may be formed between the third non-conductive region 1113 of the second portion 7112 and the third conductive region 1133 of the first portion 7111. For example, the first conductive patterns 90 of the first rigid portion 711 may be formed between the third non-conductive region 1113 of the second portion 7112 and a portion (711e of FIG. 8) of the first portion 7111. The first conductive patterns 90 of the first rigid portion 711 may extend in parallel with each other, but are not limited thereto.

The first rigid portion 711 may be located between the plug 511 and the second rigid portion 712. Therefore, the first conductive patterns 90 must pass through the first rigid portion 711 to electrically connect the second electronic circuit 532 on the second rigid portion 712 to the plug 511. Since the first conductive patterns 90 passing through the first rigid portion 711 are formed of a conductive material, performance of an antenna using a slot (80 of FIG. 8) may be affected. In an embodiment of the disclosure, the first conductive patterns 90 of the first rigid portion 711 may have a shape protruding in a direction from the first edge 711a toward the first portion 7111 (or the second edge 711b). For example, the first conductive patterns 90 of the first rigid portion 711 may include a first section 91 connected to the first flexible portion 761, a second section 92 connected to the second flexible portion 762 and a third section 93 connecting the first section 91 to the second section 92. The third section 93 may be farther from the first edge 711a of the first rigid portion 711 than the first section 91 and the second section 92. The third section 93 may be formed to be longer than the first section 91 and the second section 92. The third non-conductive region 1113 may be formed from the first edge 711a to the first conductive patterns 90. In this way, by reducing a region in which the slot (80 of FIG. 8) is closed by the first conductive patterns 90 and increasing a region in which the third non-conductive region 1113 covers the slot (80 of FIG. 8), it may reduce deterioration of the performance of the antenna using the slot (80 of FIG. 8) by the first conductive patterns 90.

In an embodiment of the disclosure, the first conductive patterns 90 of the first rigid portion 711 may be formed on the third layer L3. However, it is not limited thereto. For example, at least some of the first conductive patterns 90 of the first rigid portion 711 may be formed on the first layer L1, the second layer L2, or the fourth layer L4 of the first portion 711.

The first conductive patterns 90 may be referred to as first conductive traces, first conductive paths, first conductive lines, first electrical paths, or first conductive wires.

Referring to FIGS. 10 and 11D, the flexible printed circuit board 50 according to an embodiment may include the fourth layer L4. The first portion 7111 of the first rigid portion 711 may include a fourth conductive region 1134 formed on the fourth layer L4. The second portion 7112 of the first rigid portion 711 may include a fourth non-conductive region 1114 formed on the fourth layer L4. The fourth non-conductive region 1114 may extend from the first edge 711a of the first rigid portion 711 toward the first portion 7111. For example, the fourth non-conductive region 1114 may extend from the entire first edge 711a toward the second edge 711b. When the first rigid portion 711 is viewed perpendicularly, the third non-conductive region 1113 may at least partially overlap the first non-conductive region 1111, the second non-conductive region 1112, and the third non-conductive region 1113.

Referring to FIG. 8 together, the non-conductive portion (e.g., the first non-conductive region 1111, the second non-conductive region 1112, the third non-conductive region 1113, and the fourth non-conductive region 1114) of the second portion 7112 according to an embodiment may be arranged with respect to the slot 80. For example, the non-conductive portion of the second portion 7112 may be located adjacent to the slot 80. For example, the non-conductive portion of the second portion 7112 may be located at least partially in the slot 80. For example, the non-conductive portion of the second portion 7112 may overlap the slot 80 when viewed in a direction perpendicular to the first rigid portion 711. For example, the non-conductive portion of the second portion 7112 may face the slot 80. For example, the non-conductive portion of the second portion 7112 may cover the slot 80. For example, the non-conductive portion of the second portion 7112 may form the slot 80 together with the display 120 and the frame 410.

In an embodiment of the disclosure, the non-conductive portion of the second portion 7112 may extend from the first edge 711a of the first rigid portion 711 toward the second portion 7112 (or the second edge 711b).

In an embodiment of the disclosure, mass (or volume) of the non-conductive portion in the second portion 7112 may be greater than mass (or volume) of the non-conductive portion in the first portion 7111. In an embodiment of the disclosure, an area of the non-conductive portion of each of the plurality of layers in the second portion 7112 may be larger than an area of the non-conductive portion of each of the plurality of layers in the first portion 7111. For example, a sum of the areas of the first non-conductive region 1111 of the first layer L1, the second non-conductive region 1112 of the second layer L2, the third non-conductive region 1113 of the third layer L3, and the fourth non-conductive region 1114 of the fourth layer L4 may be greater than a sum of the areas of the non-conductive regions of the first portion 7111 formed on the first layer L1, the second layer L2, the third layer L3, and the fourth layer L4.

The first non-conductive region 1111, the second non-conductive region 1112, the third non-conductive region 1113, and the fourth non-conductive region 1114 may be referred to as a first fill-cut region, a second fill-cut region, a third fill-cut region, and a fourth fill-cut region, respectively. The fill-cut region may mean a region in which a metal plating layer (or a conductive material) is absent or removed from a printed circuit board.

Figure 12:
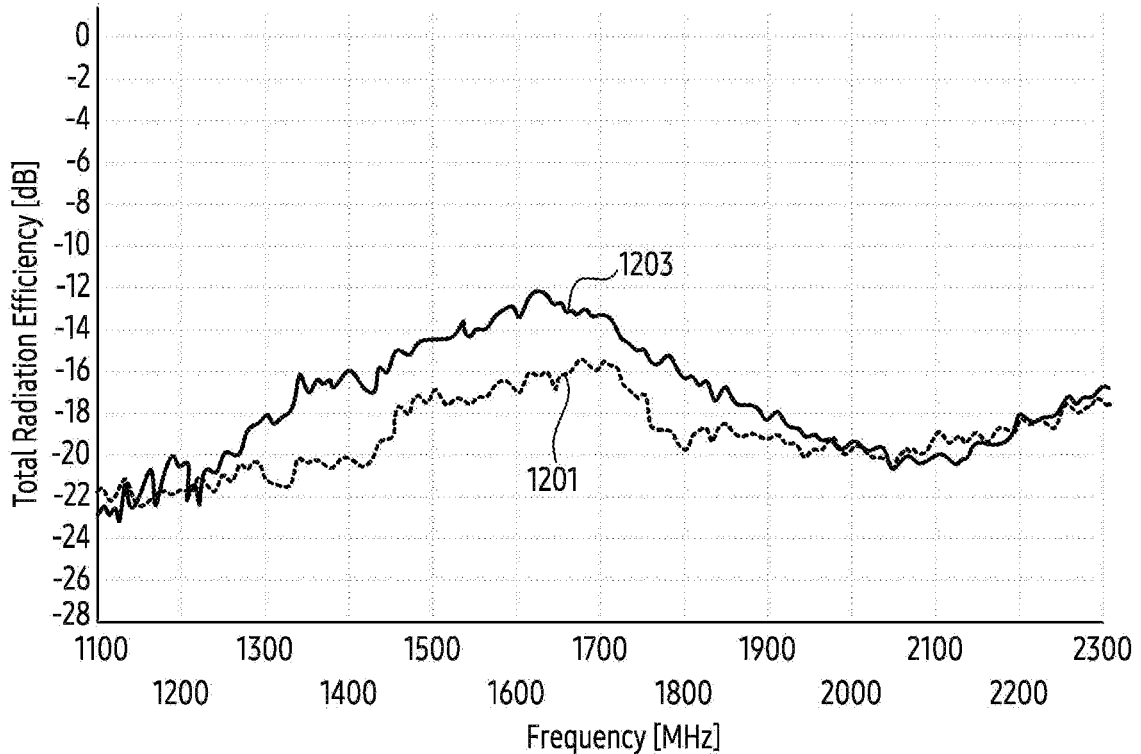
FIG. 12 is a graph indicating radiation efficiency according to frequency according to an embodiment of the disclosure.

FIG. 12 is a graph indicating radiation efficiency according to frequency according to an embodiment of the disclosure.

Referring to FIG. 12, a graph 1201 indicates radiation efficiency of the comparative embodiment.

A graph 1203 indicates radiation efficiency of the electronic device 400 according to an embodiment. An electronic device according to the comparative embodiment may not include the non-conductive portion (e.g., a first non-conductive region 1111, a second non-conductive region 1112, a third non-conductive region 1113, and a fourth non-conductive region 1114) of a second portion 7112. For example, a flexible printed circuit board of the electronic device according to the comparative embodiment may be mostly formed of a conductive region. As the flexible printed circuit board is disposed adjacent to a slot operating as a radiation element of an antenna, the conductive region of the flexible printed circuit board may prevent radiation of the antenna using the slot. Accordingly, radiation efficiency of the antenna using the slot may be lowered. On the other hand, the electronic device 400 according to an embodiment may include the non-conductive portion of the second portion 7112 arranged for a slot 80. The non-conductive portion may not inhibit radiation of the antenna using the slot 80. Accordingly, the radiation efficiency of the antenna using the slot 80 according to an embodiment may be improved. For example, as illustrated in FIG. 12, the electronic device 400 according to an embodiment may have improved radiation efficiency in an intermediate frequency band of about 1,200 megahertz (MHz) to about 2,000 MHz compared to the comparative embodiment.

Figure 13:
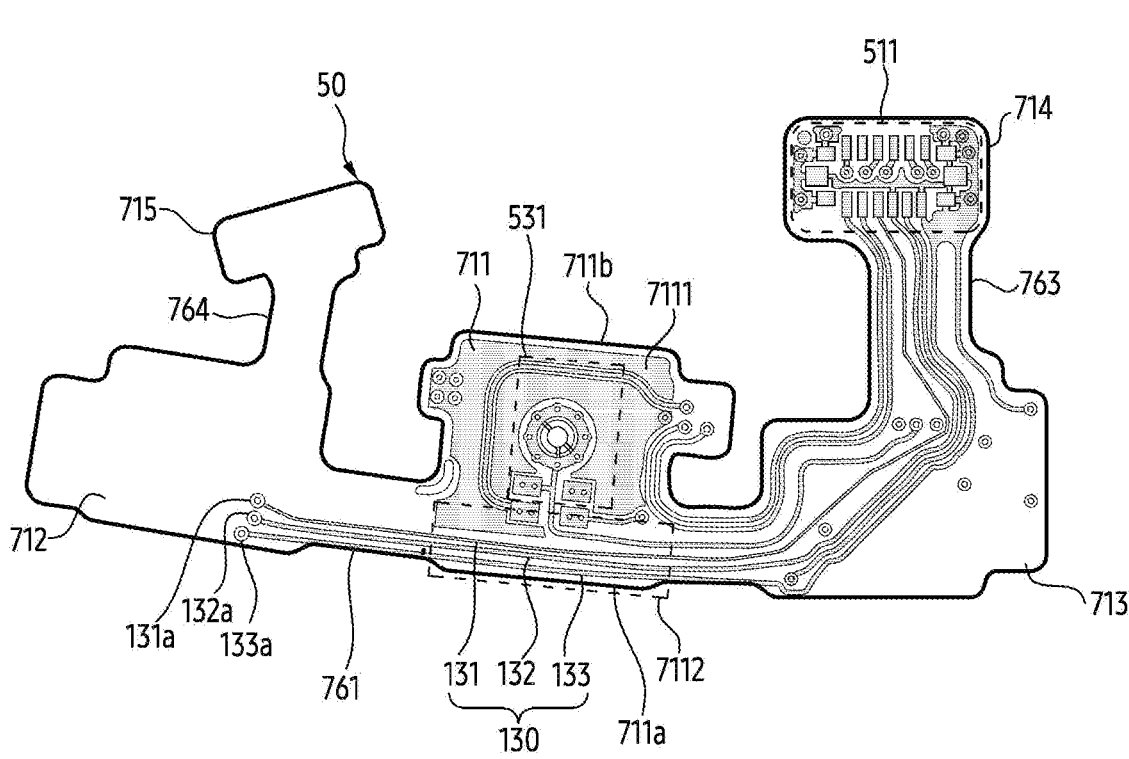
FIG. 13 is a diagram illustrating a fifth layer of a flexible printed circuit board according to an embodiment of the disclosure.

FIG. 13 is a diagram illustrating a fifth layer L5 of a flexible printed circuit board according to an embodiment of the disclosure.

Referring to FIG. 13, the flexible printed circuit board 50 according to an embodiment may include the fifth layer L5 in which second conductive patterns 130 are at least partially formed. In FIG. 13, the fifth layer L5 is illustrated similarly to a fourth layer L4 of FIG. 11D, but is not limited by the illustrated example. For example, the fifth layer L5 may be referred to as a first layer L1, a second layer L2, a third layer L3, or a fourth layer L4. For example, the second conductive patterns 130 of a first rigid portion 711 may be formed to cross a first non-conductive region 1111 of the first layer L1, a second non-conductive region 1112 of the second layer L2, a third non-conductive region 1113 of the third layer L3, or a fourth non-conductive region 1114 of the fourth layer L4. However, the second conductive patterns 130 of the first rigid portion 711 may be formed on a layer different from a first conductive patterns (90 of FIG. 11C) of the first rigid portion 711. Unlike the above description, the fifth layer L5 may be another layer that is distinct from the first layer L1, the second layer L2, the third layer L3, and the fourth layer L4. In this case, the second conductive patterns 130 of the first rigid portion 711 may overlap the first non-conductive region 1111, the second non-conductive region 1112, the third non-conductive region 1113, and the fourth non-conductive region 1114.

In an embodiment of the disclosure, the second conductive patterns 130 may extend from a fourth rigid portion 714 to a second rigid portion 712. For example, the second conductive patterns 130 may extend to sequentially pass through a third flexible portion 763, a third rigid portion 713, a second flexible portion 762, the first rigid portion 711, and a first flexible portion 761.

In an embodiment of the disclosure, the second conductive patterns 130 of the first rigid portion 711 may be formed on the fifth layer L5 of a second portion 7112. For example, the second conductive patterns 130 of the first rigid portion 711 may be located between a first edge 711a formed by the second portion 711 and the second portion 7112. The second conductive patterns 130 of the first rigid portion 711 may extend from the first flexible portion 761 to the second flexible portion 762 across the second portion 7112 of the first rigid portion 711. The second conductive patterns 130 of the first rigid portion 711 may extend in parallel with each other.

In an embodiment of the disclosure, the second conductive patterns 130 may include a first pattern 131, a second pattern 132, and a third pattern 133. The second pattern 132 may be located between the first pattern 131 and the third pattern 133. The third pattern 133 may be closer to the first edge 711a than the first pattern 131 and the second pattern 132.

In an embodiment of the disclosure, one end of the second conductive patterns 130 may be electrically connected to a plug 511, and other ends 131a, 132a, and 133a may be electrically opened. The second conductive patterns 130 may be electrically connected to the ground of a printed circuit board (480 of FIG. 4) through the plug 511. For example, the second conductive patterns 130 may be selectively and electrically connected to the ground through a switch (e.g., a switch 16 of FIG. 16). The switch may be disposed adjacent to a receptacle (487 of FIG. 4) of the printed circuit board (480 of FIG. 4). The switch may electrically connect any one of the first pattern 131, the second pattern 132, and the third pattern 133 to the ground.

Selectively, one or two of the first pattern 131, the second pattern 132, and the third pattern 133 may be omitted. For example, the flexible printed circuit board 50 may include the first pattern 131 and the second pattern 132, and may not include the third pattern 133. In this case, the first pattern 131 or the second pattern 132 may be selectively grounded through the switch. In addition, an end 131a of the first pattern 131 and an end 132a of the second pattern 132 may be electrically opened or connected to each other through a bead. For another example, the flexible printed circuit board 50 may include the second pattern 132 and the third pattern 133, and may not include the first pattern 131. In this case, the second pattern 132 or the third pattern 133 may be selectively grounded through the switch. In addition, the end 132a of the second pattern 132 and an end 133a of the third pattern 133 may be electrically opened or connected to each other through the bead. For another example, the flexible printed circuit board 50 may include any only one of the first pattern 131, the second pattern 132, and the third pattern 133.

Figure 14:
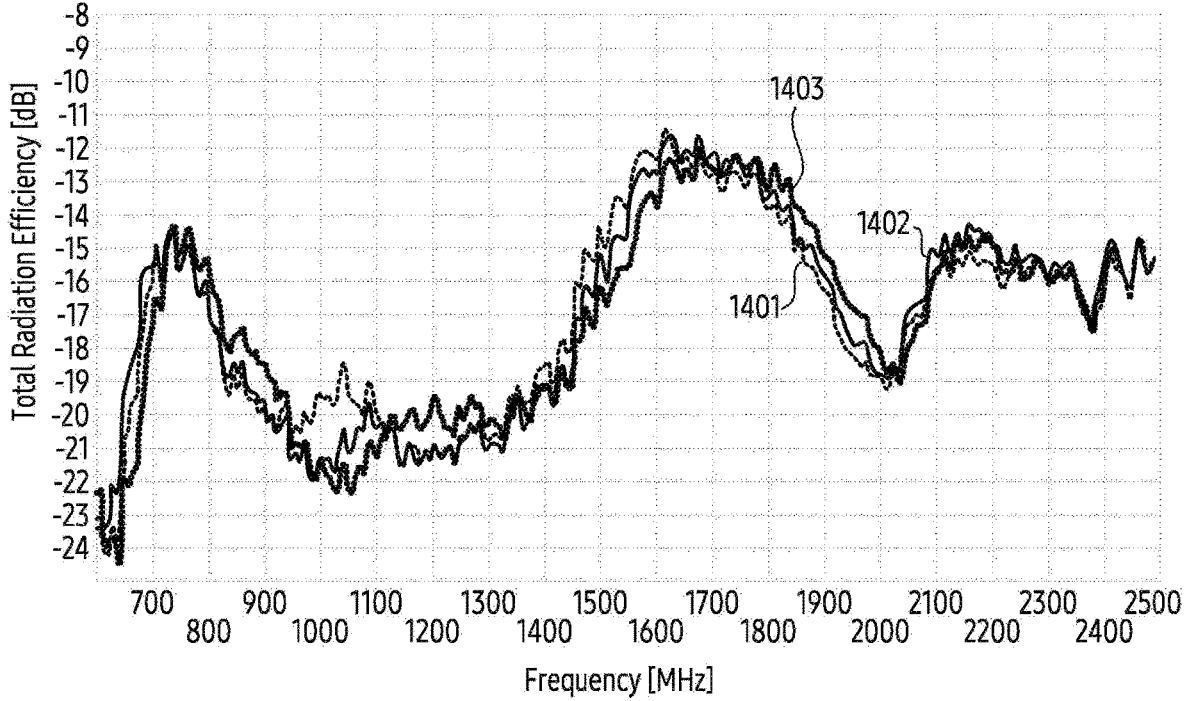
FIG. 14 is a graph indicating radiation efficiency according to a first pattern, a second pattern, or a third pattern, according to an embodiment of the disclosure.

FIG. 14 is a graph indicating radiation efficiency according to a first pattern, a second pattern, or a third pattern, according to an embodiment of the disclosure.

Referring to FIG. 14 together with FIG. 13, in an embodiment of the disclosure, according to which pattern of the second conductive patterns 130 having different locations is connected to the ground, a length of an electric field formed by an antenna using a slot 80 between the display 120 and a frame 410 may vary. Accordingly, a resonance frequency of the antenna may be shifted. For example, as illustrated in FIG. 14, in a frequency band of about 1,400 MHz to about 2,000 MHz, a resonance frequency of the second pattern indicated by a graph 1402 may be down shifted from a resonance frequency of the third pattern indicated by a graph 1403. In the frequency band of about 1,400 MHz to about 2,000 MHz, the resonant frequency of the first pattern indicated by a graph 1401 may be down shifted from the resonance frequency of the second pattern 132 indicated by the graph 1402. In an embodiment of the disclosure, as a flexible printed circuit board 50 includes only one of the first pattern 131, the second pattern 132, and the third pattern 133, the resonance frequency may be adjusted. In an embodiment of the disclosure, the resonance frequency may be adjusted by connecting any one of the first pattern 131, the second pattern 132, and the third pattern 133 to the ground using the switch.

The second conductive patterns 130 may be referred to as second conductive traces, second conductive paths, second conductive lines, second electrical paths, or second conductive wires.

Figure 15:
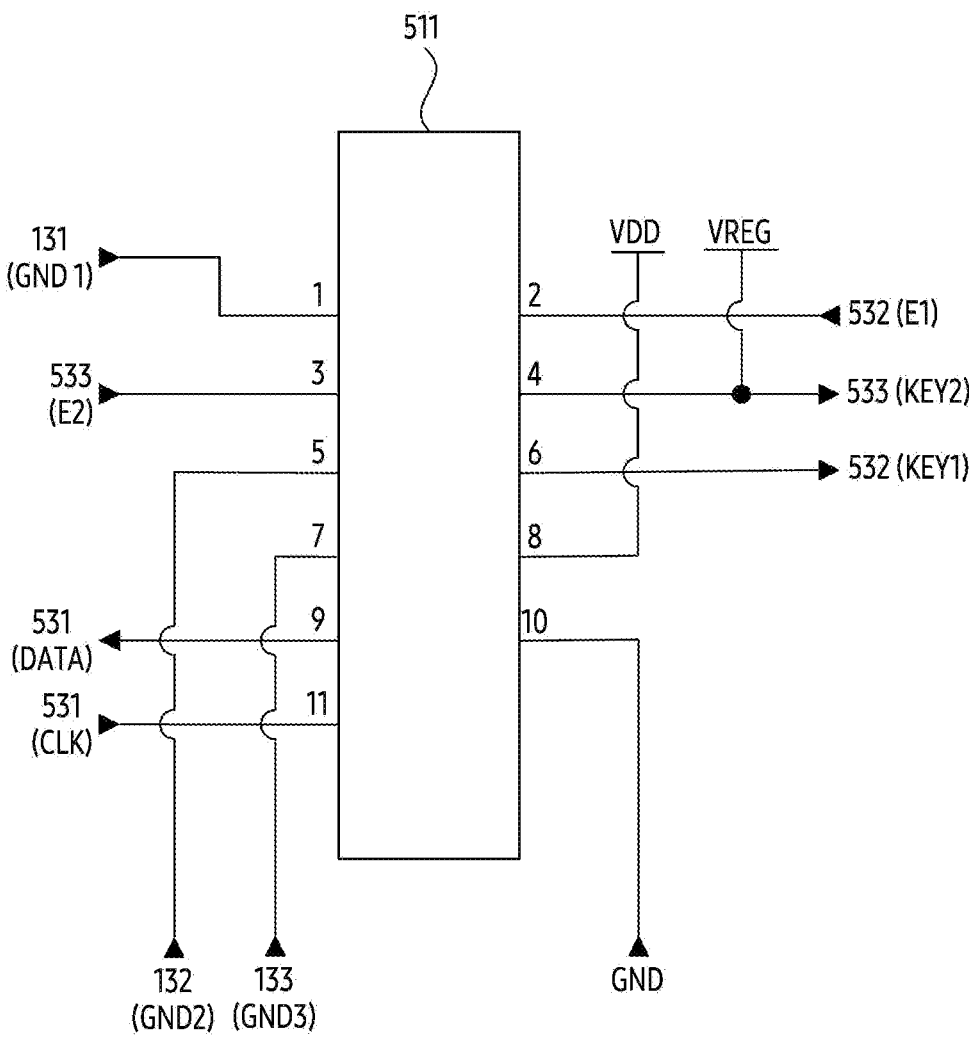
FIG. 15 is a circuit diagram of a connector of a flexible printed circuit board according to an embodiment of the disclosure.

FIG. 15 is a circuit diagram of a plug of a flexible printed circuit board according to an embodiment of the disclosure.

Referring to FIG. 15, in an embodiment of the disclosure, the plug 511 may include a plurality of pins 1, 2, 3, 4, 5, 6, 7, 8, 9, and 10. A first pin 1 may transmit a ground signal GND1 by being electrically connected to a first pattern 131. A second pin 2 may transmit a biometric signal E1 by being electrically connected to a second electronic circuit 532. A third pin 3 may transmit a biometric signal E2 by being electrically connected to a third electronic circuit 533. A fourth pin 4 may transmit an input signal of a second button 417 by being electrically connected to the third electronic circuit 533. A fifth pin 5 may transmit a ground signal GND2 by being electrically connected to a second pattern 132. A seventh fin 7 may transmit a ground signal GND3 by being electrically connected to a third pattern 133. A ninth pin 9 may transmit a signal (DATA) (e.g., an acoustic signal) obtained from the first electronic circuit 531 by being electrically connected to the first electronic circuit 531. A tenth pin 10 may transmit a ground signal GND by being electrically connected to a ground line distinct from the first pattern 131, the second pattern 132, and the third pattern 133. The ground line may be electrically connected to at least one of the first electronic circuit 531, the second electronic circuit 532, the third electronic circuit 533, and a conductive region (521 of FIG. 10). Each of the ground line and the tenth pin 10 for transmitting the ground signal GND may be implemented in plural numbers, but is not limited thereto. An eleventh pin 11 may transmit a clock signal CLK for an operation of the first electronic circuit 531 by being electrically connected to the first electronic circuit 531. Driving voltages VREG and VDD may be supplied through a fourth fin 4 and an eighth fin 8. Although not illustrated, a matching circuit and/or a protection circuit may be connected to at least some of the lines connected to the plug 511. The plug 511 may further include a pin that is not illustrated.

Figure 16:
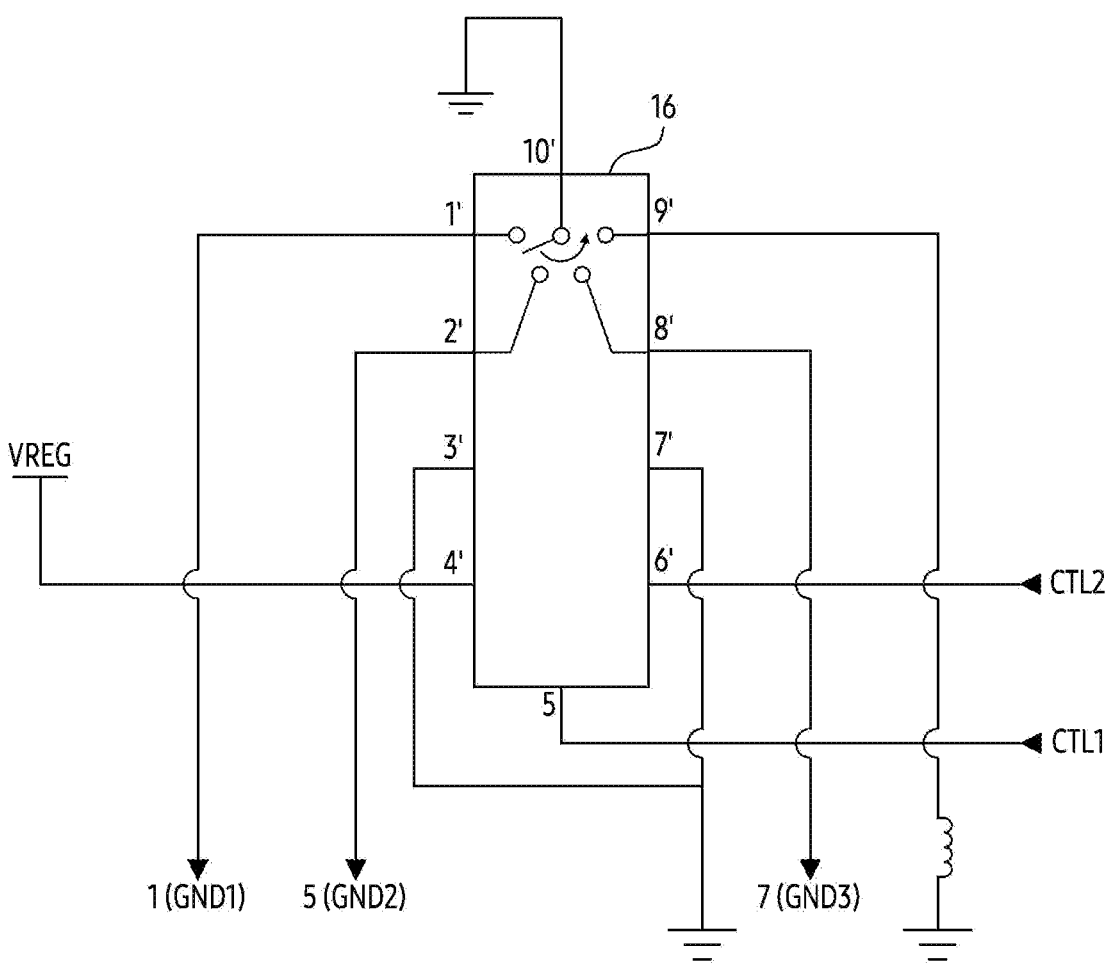
FIG. 16 is a circuit diagram of a switch according to an embodiment of the disclosure.

FIG. 16 is a circuit diagram of a switch according to an embodiment of the disclosure.

Referring to FIG. 16 together with FIG. 15, the switch 16 according to an embodiment may operate based on control signals CTL1 and CTL2 inputted through a fifth pin 5' and a sixth pin 6'. A tenth pin 10' may be electrically connected to the ground of a printed circuit board (480 of FIG. 4). A first pin 1' may transmit a ground signal GND1 by being electrically connected to a first pin 1 of a plug 511. A second pin 2' may transmit a ground signal GND2 by being electrically connected to a fifth pin 5 of the plug 511. A ninth pin 9' may be electrically connected to the ground of the printed circuit board (480 of FIG. 4). A tenth pin 10' may be electrically connected to any one of the first pin 1', the second pin 2', an eighth pin 8', and the ninth pin 9' based on the control signals CTL1 and CTL2. In other words, the switch 16 may electrically connect any one of a first pattern 131 connected to the first pin 1', a second pattern 2' connected to the second pin 2', and a third pattern 133 connected to the ninth pin 9' to the ground. The ninth pin 9' may be connected to the ground, but is not limited thereto. For example, the ninth pin 9' may be electrically opened. For example, second conductive patterns 130 may further include a fourth pattern disposed at a location different from that of the first pattern 131, a second pattern 132, and the third pattern 133, and the fourth pattern may be selectively connected to the ground through the ninth pin 9'. A driving voltage VREG' may be supplied to a fourth fin 4'. In an embodiment of the disclosure, the switch 16 may include a single-pole quad-throw (SP4T) switch, but is not limited thereto. The switch 16 may omit the ninth pin 9', and in this case, the switch 16 may be configured as a single-pole triple-throw (SP3T) switch. Although not illustrated, a matching circuit and/or a protection circuit may be connected to at least some of the lines connected to the switch 16.

A wearable electronic device (e.g., the electronic device 400 of FIG. 4) according to an embodiment may comprise a housing (e.g., a housing 310 of FIG. 3) including a metal frame (e.g., a frame 410 of FIG. 4), a display (e.g., the display 120 of FIG. 4) within the housing, a bracket (e.g., a bracket 460 of FIG. 8) within the housing, including a side surface (e.g., a side surface 460C of FIG. 8) facing an inner surface (e.g., an inner surface 410a of FIG. 8) of the metal frame, a rigid flexible printed circuit board (e.g., a flexible printed circuit board of FIG. 4) including a rigid portion (e.g., a first rigid portion 711 of FIG. 7) located between the inner surface of the metal frame and the side surface of the bracket, and an electronic circuitry (e.g., a first electronic circuitry 531 of FIG. 4) on the rigid portion 711. The rigid portion may include a first portion (e.g., a first portion 7111 of FIG. 8) under the electronic circuitry, and a second portion (e.g., a second portion 7112 of FIG. 8) extending from a portion (e.g., a portion 711e of FIG. 8) of the first portion toward the display and disposed on the side surface of the bracket so that the rigid portion is supported by the bracket. The second portion may include a non-conductive portion (e.g., a first non-conductive region 1111 of FIG. 11A, a second non-conductive region 1112 of FIG. 11B, a third non-conductive region 1113 of FIG. 11C, and a fourth non-conductive region 1114 of FIG. 11D) arranged with respect to a slot (e.g., a slot 80 of FIG. 8) between the metal frame and a portion of the display, the slot used to radiate a signal to an external electronic device. The non-conductive region may improve radiation efficiency of an antenna radiating radio waves through the slot.

In an embodiment of the disclosure, the second portion may form a first edge (e.g., a first edge 711a of FIG. 8) of the rigid portion facing the display by extending from the portion of the first portion toward the display. The non-conductive portion may extend from the first edge of the rigid portion toward the first portion.

In an embodiment of the disclosure, the rigid flexible printed circuit board may include first conductive patterns (e.g., a first conductive patterns 90 of FIG. 10) formed between the first portion and the non-conductive portion of the second portion. The first conductive patterns may have a shape protruding toward the first portion when viewed in a direction perpendicular to the rigid portion. Through this, the radiation efficiency of the antenna radiating radio waves through the slot may be increased by increasing an area where the non-conductive portion covers the slot.

In an embodiment of the disclosure, the first conductive patterns may include a first section (e.g., a first section 91 of FIG. 11C), a second section (e.g., a second section 92 of FIG. 11C), and a third section (e.g., a third section 93 of FIG. 11C) connecting the first section and the second section. The third section may be farther from the first edge of the rigid portion than the first section and the second section. A length of the third section may be longer than the first section and the second section.

In an embodiment of the disclosure, the rigid portion may include a plurality of layers (e.g., a first layer L1 of FIG. 11A, a second layer L2 of FIG. 11B, a third layer L3 of FIG. 11C, and a fourth layer L4 of FIG. 11D). The non-conductive portion of the second portion may include a first non-conductive region (e.g., a first non-conductive region 1111 of FIG. 11A) of a first layer (e.g., the first layer L1 of FIG. 11A) and a second non-conductive region (e.g., a second non-conductive region 1112 of FIG. 11B) of a second layer (e.g., the second layer L2 of FIG. 11B) overlapping the first non-conductive region. A first conductive region (e.g., a first conductive region 1131 of FIG. 11A) may be formed in the first layer of the first portion. The first conductive patterns may be formed between the first conductive region and the first non-conductive region.

The wearable electronic device according to an embodiment may comprise a printed circuit board (e.g., a printed circuit board 480 of FIG. 4) under the bracket. The rigid flexible printed circuit board may include a connection portion (e.g., a first connection portion 51 of FIG. 7) disposed on the printed circuit board and an extension portion (e.g., an extension portion 53 of FIG. 7) extending from the connection portion and disposed between the inner surface of the metal frame and the side surface of the bracket. The rigid portion may be a first rigid portion (e.g., a first rigid portion 711 of FIG. 7). The electronic circuitry may be a first electronic circuitry (e.g., a first electronic circuitry 531 of FIG. 7). The extension portion may include the first rigid portion and a second rigid portion. The first rigid portion may be located between the connection portion and the second rigid portion. The wearable electronic device may include a second electronic circuitry (e.g., a second electronic circuitry 532 of FIG. 7) on the second rigid portion. The first conductive patterns may extend from the connection portion through the first rigid portion to the second rigid portion and are electrically connected to the second electronic circuitry.

In an embodiment of the disclosure, the rigid flexible printed circuit board may include at least one second conductive pattern (e.g., at least one of a first pattern 131, a second pattern 132, and a third pattern 133 of FIG. 13) extending from the second rigid portion through the first rigid portion to the connection portion. The at least one second conductive pattern of the first rigid portion may be formed in the non-conductive portion of the second portion. The at least one second conductive pattern may be electrically connected to a ground of the printed circuit board through the connection portion. A resonance frequency of the antenna radiating radio waves through the slot may be adjusted through the at least one second conductive pattern.

In an embodiment of the disclosure, the at least one second conductive pattern may include a plurality of second conductive patterns (e.g., second conductive patterns 130 of FIG. 13).

In an embodiment of the disclosure, the second conductive patterns may be formed on a third layer (e.g., the third layer L3 of FIG. 11C) of the second portion.

The wearable electronic device according to an embodiment may comprise a switch (e.g., a switch 16 of FIG. 16) on the printed circuit board. The switch may selectively electrically connect one of the second conductive patterns to the ground. Through the switch, the resonance frequency of the antenna radiating radio waves through the slot may be adjusted.

In an embodiment of the disclosure, each of ends (e.g., ends 131a, 132a, 133a of FIG. 13) of the second conductive patterns located in the second rigid portion may be electrically open.

In an embodiment of the disclosure, the second conductive patterns may include a first pattern (e.g., the first pattern 131 of FIG. 13) and a second pattern (e.g., the second pattern 132 of FIG. 13). The rigid flexible printed circuit board may include a bead on the second rigid portion. The bead electrically may connect an end (e.g., the end 131a of FIG. 13) of the first pattern and an end (e.g., the end 132a of FIG. 13) of the second pattern.

In an embodiment of the disclosure, the second conductive patterns of the first rigid portion may extend parallel to each other.

In an embodiment of the disclosure, the first conductive patterns of the rigid portion may extend parallel to each other.

In an embodiment of the disclosure, the rigid portion may be formed of a plurality of layers. An area of the non-conductive portion of each of the plurality of layers in the second portion 7112 may be larger than an area of the non-conductive portion of each of the plurality of layers in the first portion.

In an embodiment of the disclosure, when viewed in a direction perpendicular to the rigid portion, the non-conductive portion of the second portion may overlap the slot.

In an embodiment of the disclosure, the non-conductive portion of the second portion may be located at least partially within the slot.

In an embodiment of the disclosure, the rigid portion may include a second edge (e.g., a second edge 711b of FIG. 8) opposite to the first edge formed by the second portion. The rigid portion may be inclined so that the first edge is located further inside the housing than the second edge.

In an embodiment of the disclosure, the bracket may include a recess (e.g., a recess 465 of FIG. 8) formed on the side surface and a peripheral portion of the recess. The electronic circuitry on the first portion may be received in the recess. The second portion may be disposed on the peripheral portion.

In an embodiment of the disclosure, the electronic circuitry may include an acoustic sensor.

A wearable electronic device (e.g., the electronic device 400 of FIG. 4) according to an embodiment may comprise a housing (e.g., the housing 310 of FIG. 3) including a metal frame (e.g., the frame 410 of FIG. 4), a display panel (e.g., the display 120 of FIG. 4) in the housing, a slot antenna at least partially formed by a gap (e.g., the slot 80 of FIG. 8) between the metal frame and the display panel, and a rigid flexible printed circuit board (e.g., the flexible printed circuit board 50 of FIG. 4) including a rigid portion (e.g., the first rigid portion 711 of FIG. 7) on which an electronic circuitry (e.g., the first electronic circuit 531 of FIG. 4) is disposed and a plurality of conductive traces (e.g., the first conductive patterns 90 of FIG. 10) crossing the rigid portion. An upper end portion (e.g., the second portion 7112 of FIG. 8) of the rigid portion facing the gap may be formed as a fill-cut region that does not contain a conductive material. The plurality of conductive traces of the rigid portion may be formed between a lower end portion (e.g., the first portion 7111 of FIG. 8) of the rigid portion and the fill-cut region. The plurality of conductive traces may protrude in a direction from the upper end portion of the rigid portion toward the lower end portion such that an area of the fill-cut region is widened. The slot antenna may radiate radio waves using the gap extended by the fill-cut region. Through this, the performance of the slot antenna may be improved.

In an embodiment of the disclosure, the rigid flexible printed circuit board may include first conductive patterns formed between a first portion under the electronic circuitry and a non-conductive portion of a second portion. The second portion may extend from a portion of the first portion toward the display panel and may be disposed on a side surface of a bracket within the housing so that the rigid portion is supported by the bracket. The first conductive patterns may have a shape protruding toward the first portion when viewed in a direction perpendicular to the rigid portion.

In an embodiment of the disclosure, the first conductive patterns may include a first section, a second section, and a third section connecting the first section and the second section. The third section may be farther from a first edge of the rigid portion than the first section and the second section. A length of the third section may be longer than the first section and the second section.

FIG. 17 is a block diagram illustrating an electronic device in a network environment according to an embodiment of the disclosure.

Referring to FIG. 17, an electronic device 1701 in a network environment 1700 may communicate with an electronic device 1702 via a first network 1798 (e.g., a short-range wireless communication network), or at least one of an electronic device 1704 or a server 1708 via a second network 1799 (e.g., a long-range wireless communication network). According to an embodiment of the disclosure, the electronic device 1701 may communicate with the electronic device 1704 via the server 1708. According to an embodiment of the disclosure, the electronic device 1701 may include a processor 1720, memory 1730, an input module 1750, a sound output module 1755, a display module 1760, an audio module 1770, a sensor module 1776, an interface 1777, a connecting terminal 1778, a haptic module 1779, a camera module 1780, a power management module 1788, a battery 1789, a communication module 1790, a subscriber identification module (SIM) 1796, or an antenna module 1797. In some embodiments of the disclosure, at least one of the components (e.g., the connecting terminal 1778) may be omitted from the electronic device 1701, or one or more other components may be added in the electronic device 1701. In some embodiments of the disclosure, some of the components (e.g., the sensor module 1776, the camera module 1780, or the antenna module 1797) may be implemented as a single component (e.g., the display module 1760).

The processor 1720 may execute, for example, software (e.g., a program 1740) to control at least one other component (e.g., a hardware or software component) of the electronic device 1701 coupled with the processor 1720, and may perform various data processing or computation. According to an embodiment of the disclosure, as at least part of the data processing or computation, the processor 1720 may store a command or data received from another component (e.g., the sensor module 1776 or the communication module 1790) in volatile memory 1732, process the command or the data stored in the volatile memory 1732, and store resulting data in non-volatile memory 1734. According to an embodiment of the disclosure, the processor 1720 may include a main processor 1721 (e.g., a central processing unit (CPU) or an application processor (AP)), or an auxiliary processor 1723 (e.g., a graphics processing unit (GPU), a neural processing unit (NPU), an image signal processor (ISP), a sensor hub processor, or a communication processor (CP)) that is operable independently from, or in conjunction with, the main processor 1721. For example, when the electronic device 1701 includes the main processor 1721 and the auxiliary processor 1723, the auxiliary processor 1723 may be adapted to consume less power than the main processor 1721, or to be specific to a specified function. The auxiliary processor 1723 may be implemented as separate from, or as part of the main processor 1721.

The auxiliary processor 1723 may control at least some of functions or states related to at least one component (e.g., the display module 1760, the sensor module 1776, or the communication module 1790) among the components of the electronic device 1701, instead of the main processor 1721 while the main processor 1721 is in an inactive (e.g., a sleep) state, or together with the main processor 1721 while the main processor 1721 is in an active state (e.g., executing an application). According to an embodiment of the disclosure, the auxiliary processor 1723 (e.g., an image signal processor or a communication processor) may be implemented as part of another component (e.g., the camera module 1780 or the communication module 1790) functionally related to the auxiliary processor 1723. According to an embodiment of the disclosure, the auxiliary processor 1723 (e.g., the neural processing unit) may include a hardware structure specified for artificial intelligence model processing. An artificial intelligence model may be generated by machine learning. Such learning may be performed, e.g., by the electronic device 1701 where the artificial intelligence is performed or via a separate server (e.g., the server 1708). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1730 may store various data used by at least one component (e.g., the processor 1720 or the sensor module 1776) of the electronic device 1701. The various data may include, for example, software (e.g., the program 1740) and input data or output data for a command related thereto. The memory 1730 may include the volatile memory 1732 or the non-volatile memory 1734.

The program 1740 may be stored in the memory 1730 as software, and may include, for example, an operating system (OS) 1742, middleware 1744, or an application 1746.

The input module 1750 may receive a command or data to be used by another component (e.g., the processor 1720) of the electronic device 1701, from the outside (e.g., a user) of the electronic device 1701. The input module 1750 may include, for example, a microphone, a mouse, a keyboard, a key (e.g., a button), or a digital pen (e.g., a stylus pen).

The sound output module 1755 may output sound signals to the outside of the electronic device 1701. The sound output module 1755 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 1760 may visually provide information to the outside (e.g., a user) of the electronic device 1701. The display module 1760 may include, for example, a display, a hologram device, or a projector and control circuitry to control a corresponding one of the display, hologram device, and projector. According to an embodiment of the disclosure, the display module 1760 may include a touch sensor adapted to detect a touch, or a pressure sensor adapted to measure the intensity of force incurred by the touch.

The audio module 1770 may convert a sound into an electrical signal and vice versa. According to an embodiment of the disclosure, the audio module 1770 may obtain the sound via the input module 1750, or output the sound via the sound output module 1755 or a headphone of an external electronic device (e.g., an electronic device 1702) directly (e.g., wiredly) or wirelessly coupled with the electronic device 1701.

The sensor module 1776 may detect an operational state (e.g., power or temperature) of the electronic device 1701 or an environmental state (e.g., a state of a user) external to the electronic device 1701, and then generate an electrical signal or data value corresponding to the detected state. According to an embodiment of the disclosure, the sensor module 1776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1777 may support one or more specified protocols to be used for the electronic device 1701 to be coupled with the external electronic device (e.g., the electronic device 1702) directly (e.g., wiredly) or wirelessly. According to an embodiment of the disclosure, the interface 1777 may include, for example, a high definition multimedia interface (HDMI), a universal serial bus (USB) interface, a secure digital (SD) card interface, or an audio interface.

A connecting terminal 1778 may include a connector via which the electronic device 1701 may be physically connected with the external electronic device (e.g., the electronic device 1702). According to an embodiment of the disclosure, the connecting terminal 1778 may include, for example, an HDMI connector, a USB connector, an SD card connector, or an audio connector (e.g., a headphone connector).

The haptic module 1779 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 1779 may include, for example, a motor, a piezoelectric element, or an electric stimulator.

The camera module 1780 may capture a still image or moving images. According to an embodiment of the disclosure, the camera module 1780 may include one or more lenses, image sensors, image signal processors, or flashes.

The power management module 1788 may manage power supplied to the electronic device 1701. According to an embodiment of the disclosure, the power management mod-ule 1788 may be implemented as at least part of, for example, a power management integrated circuit (PMIC).

The battery 1789 may supply power to at least one component of the electronic device 1701. According to an embodiment of the disclosure, the battery 1789 may include, for example, a primary cell which is not rechargeable, a secondary cell which is rechargeable, or a fuel cell.

The communication module 1790 may support establishing a direct (e.g., wired) communication channel or a wireless communication channel between the electronic device 1701 and the external electronic device (e.g., the electronic device 1702, the electronic device 1704, or the server 1708) and performing communication via the established communication channel. The communication module 1790 may include one or more communication processors that are operable independently from the processor 1720 (e.g., the application processor (AP)) and supports a direct (e.g., wired) communication or a wireless communication. According to an embodiment of the disclosure, the communication module 1790 may include a wireless communication module 1792 (e.g., a cellular communication module, a short-range wireless communication module, or a global navigation satellite system (GNSS) communication module) or a wired communication module 1794 (e.g., a local area network (LAN) communication module or a power line communication (PLC) module). A corresponding one of these communication modules may communicate with the external electronic device via the first network 1798 (e.g., a short-range communication network, such as Bluetooth™, wireless-fidelity (Wi-Fi) direct, or infrared data association (IrDA)) or the second network 1799 (e.g., a long-range communication network, such as a legacy cellular network, a fifth-generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1792 may identify and authenticate the electronic device 1701 in a communication network, such as the first network 1798 or the second network 1799, using subscriber information (e.g., international mobile subscriber identity (IMSI)) stored in the subscriber identification module 1796.

The wireless communication module 1792 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1792 may support a high-frequency band (e.g., the millimeter wave (mmWave) band) to achieve, e.g., a high data transmission rate. The wireless communication module 1792 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1792 may support various requirements specified in the electronic device 1701, an external electronic device (e.g., the electronic device 1704), or a network system (e.g., the second network 1799). According to an embodiment of the disclosure, the wireless communication module 1792 may support a peak data rate (e.g., 20 gigabits per second (Gbps) or more) for implementing eMBB, loss coverage (e.g., 1764 dB or less) for implementing mMTC, or U-plane latency (e.g., 0.5 milliseconds (ms) or less for each of downlink (DL) and uplink (UL), or a round trip of 17 ms or less) for implementing URLLC.

The antenna module 1797 may transmit or receive a signal or power to or from the outside (e.g., the external electronic device) of the electronic device 1701. According to an embodiment of the disclosure, the antenna module 1797 may include an antenna including a radiating element including a conductive material or a conductive pattern formed in or on a substrate (e.g., a printed circuit board (PCB)). According to an embodiment of the disclosure, the antenna module 1797 may include a plurality of antennas (e.g., array antennas). In such a case, at least one antenna appropriate for a communication scheme used in the communication network, such as the first network 1798 or the second network 1799, may be selected, for example, by the communication module 1790 (e.g., the wireless communication module 1792) from the plurality of antennas. The signal or the power may then be transmitted or received between the communication module 1790 and the external electronic device via the selected at least one antenna. According to an embodiment of the disclosure, another component (e.g., a radio frequency integrated circuit (RFIC)) other than the radiating element may be additionally formed as part of the antenna module 1797.

According to various embodiments of the disclosure, the antenna module 1797 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 1701 and the external electronic device 1704 via the server 1708 coupled with the second network 1799. Each of the electronic devices 1702 or 1704 may be a device of a same type as, or a different type, from the electronic device 1701. According to an embodiment of the disclosure, all or some of operations to be executed at the electronic device 1701 may be executed at one or more of the external electronic devices 1702, 1704, or 1708. For example, if the electronic device 1701 should perform a function or a service automatically, or in response to a request from a user or another device, the electronic device 1701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1701. The electronic device 1701 may provide the outcome, with or without further processing of the outcome, as at least part of a reply to the request. To that end, a cloud computing, distributed computing, mobile edge computing (MEC), or client-server computing technology may be used, for example. The electronic device 1701 may provide ultra low-latency services using, e.g., distributed computing or mobile edge computing. In another embodiment of the disclosure, the external electronic device 1704 may include an Internet-of-things (IoT) device. The server 1708 may be an intelligent server using machine learning and/or a neural network. According to an embodiment of the disclosure, the external electronic device 1704 or the server 1708 may be included in the second network 1799. The electronic device 1701 may be applied to intelligent services (e.g., a smart home, a smart city, a smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 1740) including one or more instructions that are stored in a storage medium (e.g., internal memory 1736 or external memory 1738) that is readable by a machine (e.g., the electronic device 1701). For example, a processor (e.g., the processor 1720) of the machine (e.g., the electronic device 1701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

It will be appreciated that various embodiments of the disclosure according to the claims and description in the specification can be realized in the form of hardware, software or a combination of hardware and software.

Any such software may be stored in non-transitory computer readable storage media. The non-transitory computer readable storage media store one or more computer programs (software modules), the one or more computer programs include computer-executable instructions that, when executed by one or more processors of an electronic device, cause the electronic device to perform a method of the disclosure.

Any such software may be stored in the form of volatile or non-volatile storage, such as, for example, a storage device like read only memory (ROM), whether erasable or rewritable or not, or in the form of memory, such as, for example, random access memory (RAM), memory chips, device or integrated circuits or on an optically or magnetically readable medium, such as, for example, a compact disk (CD), digital versatile disc (DVD), magnetic disk or magnetic tape or the like. It will be appreciated that the storage devices and storage media are various embodiments of non-transitory machine-readable storage that are suitable for storing a computer program or computer programs comprising instructions that, when executed, implement various embodiments of the disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and details may be made therein without departing from the spirit and scope of the disclosure as defined by the appended claims and their equivalents.

No claim element is to be construed under the provisions of 35 U.S.C. § 112, sixth paragraph, unless the element is expressly recited using the phrase "means for" or "means".

What is claimed is:

1. A wearable electronic device comprising:
a housing including a metal frame;
a display within the housing;
a bracket within the housing, including a side surface facing an inner surface of the metal frame;
a rigid flexible printed circuit board including a rigid portion located between the inner surface of the metal frame and the side surface of the bracket; and
an electronic circuitry on the rigid portion,
wherein the rigid portion includes:
a first portion under the electronic circuitry, and
a second portion extending from a portion of the first portion toward the display and disposed on the side surface of the bracket so that the rigid portion is supported by the bracket, and
wherein the second portion includes a non-conductive portion arranged with respect to a slot between the metal frame and a portion of the display, the slot used to radiate a radio frequency signal (RF signal) to external electronic device.

2. The wearable electronic device of claim 1,
wherein the second portion forms a first edge of the rigid portion facing the display by extending from the portion of the first portion toward the display, and
wherein the non-conductive portion extends from the first edge of the rigid portion toward the first portion.

3. The wearable electronic device of claim 2,
wherein the rigid flexible printed circuit board includes first conductive patterns formed between the first portion and the non-conductive portion of the second portion, and
wherein the first conductive patterns have a shape protruding toward the first portion when viewed in a direction perpendicular to the rigid portion.

4. The wearable electronic device of claim 3,
wherein the first conductive patterns include a first section, a second section, and a third section connecting the first section and the second section,
wherein the third section is farther from the first edge of the rigid portion than the first section and the second section, and
wherein a length of the third section is longer than the first section and the second section.

5. The wearable electronic device of claim 3,
wherein the rigid portion is formed of a plurality of layers,
wherein the non-conductive portion of the second portion includes a first non-conductive region of a first layer and a second non-conductive region of a second layer overlapping the first non-conductive region, wherein a first conductive region is formed in the first layer of the first portion, and wherein the first conductive patterns are formed between the first conductive region and the first non-conductive region.

6. The wearable electronic device of claim 5, further comprising:

a printed circuit board under the bracket, wherein the rigid flexible printed circuit board includes a connection portion disposed on the printed circuit board and an extension portion extending from the connection portion and disposed between the inner surface of the metal frame and the side surface of the bracket, wherein the rigid portion is a first rigid portion, wherein the electronic circuitry is a first electronic circuitry, wherein the extension portion includes the first rigid portion and a second rigid portion, wherein the first rigid portion is located between the connection portion and the second rigid portion, wherein the wearable electronic device includes a second electronic circuitry on the second rigid portion, and wherein the first conductive patterns extend from the connection portion through the first rigid portion to the second rigid portion and are electrically connected to the second electronic circuitry.

7. The wearable electronic device of claim 6, wherein the rigid flexible printed circuit board includes at least one second conductive pattern extending from the second rigid portion through the first rigid portion to the connection portion, wherein the at least one second conductive pattern of the first rigid portion is formed in the non-conductive portion of the second portion, and wherein the at least one second conductive pattern is electrically connected to a ground of the printed circuit board through the connection portion.

8. The wearable electronic device of claim 7, wherein the at least one second conductive pattern includes a plurality of second conductive patterns.

9. The wearable electronic device of claim 8, wherein the second conductive patterns are formed on a third layer of the second portion.

10. The wearable electronic device of claim 9, further comprising a switch on the printed circuit board, the switch configured to selectively electrically connect one of the second conductive patterns to the ground of the printed circuit board.

11. The wearable electronic device of claim 8, wherein each of ends of the second conductive patterns located in the second rigid portion is electrically open.

12. The wearable electronic device of claim 8, wherein the second conductive patterns include a first pattern and a second pattern, wherein the rigid flexible printed circuit board includes a bead on the second rigid portion, and wherein the bead electrically connects an end of the first pattern and an end of the second pattern.

13. The wearable electronic device of claim 8, wherein the second conductive patterns of the first rigid portion extend parallel to each other.

14. The wearable electronic device of claim 3, wherein the first conductive patterns of the rigid portion extend parallel to each other.

15. The wearable electronic device of claim 1 wherein the rigid portion is formed of a plurality of layers, and wherein an area of the non-conductive portion of each of the plurality of layers in the second portion is larger than an area of the non-conductive portion of each of the plurality of layers in the first portion.

16. The wearable electronic device of claim 1, wherein, when viewed in a direction perpendicular to the rigid portion, the non-conductive portion of the second portion overlaps the slot.

17. The wearable electronic device of claim 1, wherein the non-conductive portion of the second portion is located at least partially within the slot.

18. The wearable electronic device of claim 2, wherein the rigid portion includes a second edge opposite to the first edge formed by the second portion, and wherein the rigid portion is inclined so that the first edge is located further inside the housing than the second edge.

19. The wearable electronic device of claim 1, wherein the bracket includes a recess formed on the side surface and a peripheral portion of the recess, wherein the electronic circuitry on the first portion is received in the recess, wherein the second portion is disposed on the peripheral portion, and wherein the electronic circuitry includes an acoustic sensor.

20. A wearable electronic device comprising:

a housing including a metal frame;

a display panel in the housing;

a slot antenna at least partially formed by a gap between the metal frame and the display panel; and a rigid flexible printed circuit board including a rigid portion on which an electronic circuitry is disposed and a plurality of conductive traces crossing the rigid portion, wherein an upper end portion of the rigid portion facing the gap is formed as a fill-cut region that does not contain a conductive material, wherein the plurality of conductive traces of the rigid portion are formed between a lower end portion of the rigid portion and the fill-cut region, and protrude in a direction from the upper end portion of the rigid portion toward the lower end portion such that an area of the fill-cut region is widened, and wherein the slot antenna radiates radio waves using the gap extended by the fill-cut region.

* * * * *